(12) United States Patent
Okada et al.

(10) Patent No.: US 6,530,283 B2
(45) Date of Patent: Mar. 11, 2003

(54) FORCE SENSOR

(75) Inventors: Kazuhiro Okada, Ageo (JP);
Nobumitsu Taniguchi, Ageo (JP);
Hideo Morimoto, Yamatokooriyama (JP)

(73) Assignees: Wacoh Corporation, Saitama (JP);
Nitta Corporation, Osaka (JP)

( * ) Notice: Subject to any disclaimer, the term of this patent is extended or adjusted under 35 U.S.C. 154(b) by 0 days.

(21) Appl. No.: 09/730,429

(22) Filed: Dec. 5, 2000

(65) Prior Publication Data

US 2001/0003326 A1 Jun. 14, 2001

(30) Foreign Application Priority Data

Dec. 13, 1999 (JP) .......................................... 11-352645

(51) Int. Cl.[7] .................................................. G01B 7/16
(52) U.S. Cl. ........................................................ 73/780
(58) Field of Search ................................. 73/780, 517 A, 73/862.043, 504.12, 514.34, 517 R, 514.18, 514.16; 324/661; 257/417; 361/785

(56) References Cited

U.S. PATENT DOCUMENTS

| | | | |
|---|---|---|---|
| 4,905,523 A | 3/1990 | Okada | 73/862.04 |
| 4,967,605 A | 11/1990 | Okada | 73/862.04 |
| 4,969,366 A | 11/1990 | Okada | 73/862.08 |
| 5,014,415 A | 5/1991 | Okada | 29/621.1 |
| 5,035,148 A | 7/1991 | Okada | 73/862.04 |
| 5,092,645 A | 3/1992 | Okada | 294/86.4 |
| 5,182,515 A | 1/1993 | Okada | 324/259 |
| 5,253,526 A * | 10/1993 | Omura et al. | 73/517 R |
| 5,263,375 A | 11/1993 | Okada | 73/862.042 |
| 5,295,386 A | 3/1994 | Okada | 73/1 D |
| 5,343,765 A | 9/1994 | Okada | 73/862.043 |
| 5,365,799 A | 11/1994 | Okada | 73/862.041 |
| 5,392,658 A | 2/1995 | Okada | 73/862.043 |
| 5,406,848 A | 4/1995 | Okada | 73/517 R |
| 5,421,213 A | 6/1995 | Okada | 73/862.043 |
| 5,437,196 A | 8/1995 | Okada | 73/862.043 |

(List continued on next page.)

*Primary Examiner*—Max Noori
(74) *Attorney, Agent, or Firm*—Ladas & Parry

(57) ABSTRACT

An intermediate displacement board (120) composed of a metal plate is arranged on a printed circuit board (110) having electrode patterns (E1-E7) and then a strain generative body (130) composed of silicon rubber is arranged on top thereof. Then, the arrangement is fixed to the printed circuit board (110) with attachments (140). Depressing a displacement portion (133) causes a connecting portion (132) to be deflected and an electrode (F0) to be brought into contact with the electrodes (E1, E2) to make them conductive, thereby allowing the pushbutton switch to be turned ON. Depressing further the displacement portion (133) causes an elastic deformation portion (134) to be elastically deformed and crushed and the intermediate displacement board (120) to be pushed downward. The capacitance of capacitors (C3-C7), which are constituted by the electrodes (E3-E7) and the intermediate displacement board (120), are varied according to the depression of the intermediate displacement board (120). By detecting the variation in capacitance, it becomes possible to detect three-dimensional components of an applied force.

21 Claims, 24 Drawing Sheets

U.S. PATENT DOCUMENTS

| | | | |
|---|---|---|---|
| 5,492,020 A | 2/1996 | Okada | 73/862.626 |
| 5,497,668 A | 3/1996 | Okada | 73/862.626 |
| 5,531,002 A | 7/1996 | Okada | 29/25.41 |
| 5,531,092 A | 7/1996 | Okada | 73/1 D |
| 5,571,972 A | 11/1996 | Okada | 73/862.043 |
| 5,637,904 A * | 6/1997 | Zettler | 257/417 |
| 5,639,973 A | 6/1997 | Okada | 73/862.043 |
| 5,646,346 A | 7/1997 | Okada | 73/504.04 |
| 5,668,318 A | 9/1997 | Okada | 73/504.11 |
| 5,682,000 A | 10/1997 | Okada | 73/862.043 |
| 5,744,718 A | 4/1998 | Okada | 73/514.33 |
| 5,780,749 A | 7/1998 | Okada | 73/862.043 |
| 5,811,693 A | 9/1998 | Okada | 73/862.043 |
| 5,831,163 A | 11/1998 | Okada | 73/504.12 |
| 5,850,040 A | 12/1998 | Okada | 73/504.04 |
| 5,856,620 A | 1/1999 | Okada | 73/514.32 |
| 5,962,787 A | 10/1999 | Okada | 73/514.32 |
| 5,987,985 A | 11/1999 | Okada | 73/504.04 |
| 6,003,371 A | 12/1999 | Okada | 73/504.02 |
| 6,053,057 A | 4/2000 | Okada | 73/862.043 |
| 6,076,401 A | 6/2000 | Okada | 73/504.12 |
| 6,098,461 A | 8/2000 | Okada | 73/514.34 |
| 6,158,291 A | 12/2000 | Okada | 73/862.043 |
| 6,159,761 A | 12/2000 | Okada | 438/53 |

* cited by examiner

CENTER PORTION OF 330

FORCE SENSOR

BACKGROUND OF THE INVENTION

The present invention relates to a force sensor and, more particularly, to a force sensor which also functions as a push-button switch.

Push-button switches are used as input means to input ON/OFF information into a variety of electric appliances. In particular, low priced push-button switches employing silicon rubber have been widely used as operational buttons in various remote controllers, cellular phones, game machines, etc. In such types of push-buttons, a bowl-shaped silicon rubber is arranged upside down on an electronic circuit board and the bottom of the bowl is depressed to contact with the electrode pattern on the circuit board. The state of contact is detected electrically to thereby recognize the ON/OFF state. The push-button switch of such a type can provide a long stroke that corresponds to the height of the bowl-shaped portion. The switch also can provide a unique click feeling obtained by the elastic deformation of the bowl-shaped silicon rubber. Thus, this makes it easier for an operator to intuitively recognize through the sense of touch as to whether it is in the ON or OFF state, thereby providing highly favorable operability.

On the other hand, force sensors have also been used as devices that convert the operational inputs of operators to electrical signals. Force sensors can input operational amounts having a predetermined dynamic range as the magnitude of a force applied by the operator, while the push-button switch described above can only input ON/OFF information. Two-dimensional or three-dimensional force sensors are also used which are capable of decomposing an applied force into directional components to detect the force. In particular, capacitance-type force sensors have been used in various fields since the sensors provide the advantages of simplified structure and reduced cost. The sensor has a capacitance element formed of two electrodes to detect force based on the change in capacitance resulting from the change in spacing between the two electrodes. For example, capacitance-type multidimensional force sensors are disclosed in Japanese Laid Open Patent Publication No. 4-148833 of 1992, No. 4-249726 of 1992, No. 4-299227 of 1992, No. 4-337431 of 1992.

As described above, push-button switches and force sensors have been used in different applications, but devices having both functions are expected to be in demand in the coming years. For example, as an input device for use with game machines, a device is used having a push-button switch and a force sensor, which are separately incorporated into the device. Here, the push-button switch is to input ON/OFF information and the force sensor (i.e., the so-called "joy-stick") is to perform operational input in multidimensional directions. However, in order to improve operability, the magnitude of an applied force as well as the ON/OFF operational input can be preferably detected by means of a single device.

An object of the present invention is to provide a force sensor that can recognize the magnitude of predetermined directional components of an applied force, while providing the function of a push-button switch that detects ON/OFF operational input. A further object of the present invention is particularly to provide a force sensor which provides a sufficient stroke and favorable click feeling to serve as a push-button and provides reduced cost as well.

According to the present invention, a force sensor is realized which detects a magnitude of a predetermined directional component of an applied force, while functioning as a push-button switch that detects the operational ON/OFF input.

SUMMARY OF THE INVENTION (1) The first feature of the present invention resides in a force sensor comprising:

a circuit board arranged at a position where an upper surface thereof is contained in an X-Y plane when an XYZ three-dimensional coordinate system is defined;

an acting body attached to the upper surface of the circuit board, the acting body having a displacement portion arranged above the circuit board and displaced when an external force is applied thereto, a securing portion fixed to the circuit board, and a connecting portion for connecting the displacement portion to the securing portion;

an elastic deformation body, formed on a lower surface of the displacement portion and having elastic deformation properties;

a switch displacement electrode formed on a lower surface of the elastic deformation body;

a switch securing electrode formed on a position opposite to the switch displacement electrode on the circuit board; and a capacitor adapted to produce a variation in capacitance caused by a displacement of the displacement portion;

wherein the connecting portion has flexibility so that when a force is applied to the displacement portion, a deflection is produced in the connecting portion, thereby causing a displacement in the displacement portion relative to the circuit board;

wherein when no force is applied to the displacement portion, the switch displacement electrode and the switch securing electrode are not kept in contact with each other, and when a force of a predetermined amount, directed in a Z-axis direction of the coordinate system, is applied to the displacement portion, the switch displacement electrode and the switch securing electrode are brought into contact with each other;

wherein when a further force, directed in the Z-axis direction, is applied to the displacement portion, the elastic deformation body is elastically deformed, thereby allowing capacitance of the capacitor to vary, with the contact state kept unchanged between the switch displacement electrode and the switch securing electrode; and wherein a switch is composed of the switch displacement electrode and the switch securing electrode, and a contact state therebetween is electrically detected to thereby recognize the state of the switch and a change in capacitance of the capacitor is electrically detected to thereby recognize a magnitude of a predetermined directional component of a force applied.

(2) The second feature of the present invention resides in a force sensor according to the first feature:

wherein an acting body having a bowl-shaped portion is prepared and attached to the upper surface of the circuit board to be upside down, to use a portion corresponding to a bottom of the bowl as a displacement portion, to use a portion corresponding to a side of the bowl as a connecting portion, and to use a portion corresponding to a mouth of the bowl as a securing portion.

(3) The third feature of the present invention resides in a force sensor according to the second feature:

wherein an intermediate displacement board is disposed between the circuit board and the acting body so that a part of the intermediate displacement board is secured to the circuit board as a displacement board securing portion and another part of the intermediate displacement board constitutes a displacement board displacement portion for generating a displacement caused by a displacement in the displacement portion or a deformation in the connecting portion; and a capacitor securing electrode formed on the circuit board and a capacitor displacement electrode formed on the displacement board displacement portion constitute a capacitor.

(4) The fourth feature of the present invention resides in a force sensor according to the third feature:

wherein a flexible plate having a bowl-shaped portion constitutes the intermediate displacement board, the intermediate displacement board being attached to the upper surface of the circuit board so as to arrange the bowl-shaped portion upside down, an open window being formed for allowing the elastic deformation body to penetrate therethrough on a portion corresponding to a bottom of the bowl, a portion surrounding the open window constituting the displacement board displacement portion, a portion corresponding to a mouth of the bowl constituting the displacement board securing portion, and the displacement portion or the connecting portion being brought into physical contact with the displacement board displacement portion to generate a displacement.

(5) The fifth feature of the present invention resides in a force sensor according to the fourth feature:

wherein the intermediate displacement board is made of a metal material and the intermediate displacement board itself is used as a capacitor displacement electrode.

(6) The sixth feature of the present invention resides in a force sensor according to the fourth feature:

wherein the intermediate displacement board is made of synthetic resin and a metal film formed on a lower surface thereof composes a capacitor displacement electrode.

(7) The seventh feature of the present invention resides in a force sensor according to the sixth feature:

wherein a first additional switch electrode is formed on an upper surface of the intermediate displacement board and a second additional switch electrode is formed at a position opposite to the first additional switch electrode provided on a lower surface of the displacement portion so that both of the additional switch electrodes constituting an additional switch and a contact state between the first additional switch electrode and the second additional switch electrode is electrically detected, thereby enabling to provide additional information regarding an applied force.

(8) The eighth feature of the present invention resides in a force sensor according to the seventh feature:

wherein when the Z-axis is defined at a center of the displacement portion, an additional switch is provided at a position located above a positive X-axis and another additional switch is provided at a position located above a negative X-axis, thereby enabling to provide information regarding an X-axis component of an applied force, based on a state of a pair of the additional switches.

(9) The ninth feature of the present invention resides in a force sensor according to the eighth feature:

wherein an additional switch is further provided at a position located above a positive Y-axis and another additional switch is further provided at a position located above a negative Y-axis, thereby enabling to provide information regarding a Y-axis component of an applied force, based on a state of a pair of the further additional switches.

(10) The tenth feature of the present invention resides in a force sensor according to the seventh feature:

wherein among a set of counter electrodes constituting the additional switch, one electrode is composed of a single electrode layer and the other electrode is composed of a pair of electrode layers, electrically independent of each other, and a conductive state between the pair of electrode layers is electrically detected, thereby enabling detection of a contact state of the counter electrodes.

(11) The eleventh feature of the present invention resides in a force sensor according to the first feature:

wherein a capacitor securing electrode formed on the upper surface of the circuit board and a capacitor displacement electrode formed on a lower surface of the displacement portion constitute a capacitor.

(12) The twelfth feature of the present invention resides in a force sensor according to the eleventh feature:

wherein wiring is provided for making the capacitor displacement electrode and the switch displacement electrode conductive therebetween so that when the switch displacement electrode and the switch securing electrode are brought into contact with each other, capacitance between the switch securing electrode and the capacitor securing electrode is measured to detect a capacitance of the capacitor.

(13) The thirteenth feature of the present invention resides in a force sensor according to the eleventh feature:

wherein when the Z-axis is defined at a center of the displacement portion, a first capacitor is provided at a position located above a positive X-axis and a second capacitor is provided at a position located above a negative X-axis so as to determine direction and magnitude of an X-axis component of an applied force based on a difference in capacitance between a pair of the first and second capacitors.

(14) The fourteenth feature of the present invention resides in a force sensor according to the thirteenth feature:

wherein a third capacitor is further provided at a position located above a positive Y-axis and a fourth capacitor is provided at a position located above a negative Y-axis so as to determine direction and magnitude of a Y-axis component of an applied force based on a difference in capacitance between a pair of the third and fourth capacitors.

(15) The fifteenth feature of the present invention resides in a force sensor according to the eleventh feature:

wherein a capacitor having an electrode formed to be generally symmetric with both the X- and Y-axes is provided so that a magnitude of a Z-axis component of an applied force can be determined based on capacitance of the capacitor.

(16) The sixteenth feature of the present invention resides in a force sensor according to the eleventh feature:

wherein two sets of capacitors including a signal input capacitor and a signal output capacitor are provided, respective capacitor securing electrodes of the two sets of capacitors are composed of separate electrodes electrically independent of each other and respective capacitor displacement electrodes of the two sets of capacitors are composed of a single common electrode electrically conductive with each other; and periodic signal supply means for supplying a periodic signal to a capacitor securing electrode of the signal input capacitor and periodic signal detection means for detecting a periodic signal induced in a securing electrode of the signal output capacitor are provided so that a change in capacitance between the two sets of capacitors is obtained based on a magnitude of the periodic signal to be detected by means of the periodic signal detection means when the periodic signal of a predetermined magnitude is supplied by means of the periodic signal supply means.

(17) The seventeenth feature of the present invention resides in a force sensor according to the eleventh feature:

wherein an insulation film is formed on a surface of any one or both of a capacitor securing electrode and a capacitor displacement electrode.

(18) The eighteenth feature of the present invention resides in a force sensor according to the first feature:

wherein the switch displacement electrode is composed of a single electrode layer and the switch securing electrode is composed of a pair of electrode layers electrically independent of each other, and a contact state of the pair of the electrode layers is electrically detected so as to detect a contact state between the switch displacement electrode and the switch securing electrode.

(19) The nineteenth feature of the present invention resides in a force sensor according to the first feature:

wherein the elastic deformation portion is composed of a material having an elastic coefficient corresponding to detection sensitivity.

(20) The twentieth feature of the present invention resides in a force sensor according to the first feature:

wherein the elastic deformation portion is provided with a groove corresponding to detection sensitivity.

(21) The twenty-first feature of the present invention resides in a force sensor according to the first feature:

wherein the acting body and the elastic deformation portion are composed of a strain generative body integrally formed of rubber.

BRIEF DESCRIPTION OF THE DRAWINGS

FIG. 11 is a top view illustrating the intermediate displacement board 120B shown in FIG. 10. The section taken along the X-axis of the intermediate displacement board 120B is shown in FIG. 10.

FIG. 18 is a top view illustrating an electrode pattern formed on the upper surface of the circuit board 210 of the force sensor shown in FIG. 17.

FIG. 19 is a circuit diagram illustrating an equivalent circuit of the force sensor shown in FIG. 17.

DETAILED DESCRIPTION OF THE PREFERRED EMBODIMENTS

Figure 1:
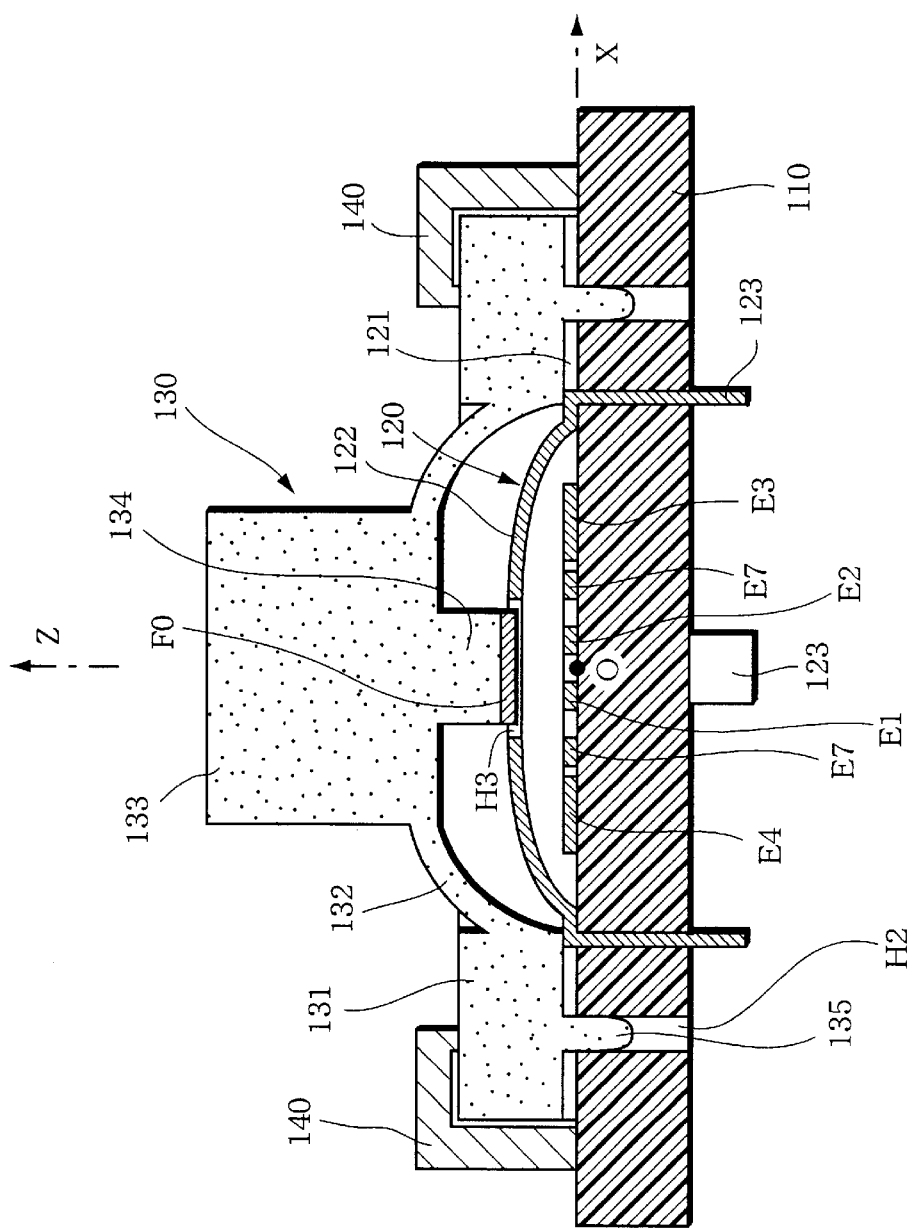
FIG. 1 is a cross-sectional side view, taken along the X-axis, illustrating the structure of a force sensor according to a first embodiment of the present invention.

The present invention will be described below according to the embodiments shown in the drawings.

§1. Configuration of the First Embodiment

FIG. 1 is a cross-sectional side view illustrating the structure of a force sensor according to a first embodiment of the present invention. The force sensor comprises a circuit board 110, an intermediate displacement board 120, a strain generative body 130 and attachments 140. For convenience in explanation, an XYZ three-dimensional coordinate system is defined here as shown in the figure to describe the arrangement of each component with reference thereto. Referring to FIG. 1, an origin O is defined at the center on the upper surface of the circuit board 110. An X-axis is defined on the right in the horizontal direction, a Z-axis in the upward vertical direction, and a Y-axis in the direction perpendicular to the X-Z plane, respectively. In this case, the upper surface of the circuit board 110 is contained in the X-Y plane, with the Z-axis passing through the center of the circuit board 110, the intermediate displacement board 120, and the strain generative body 130.

Figure 2:
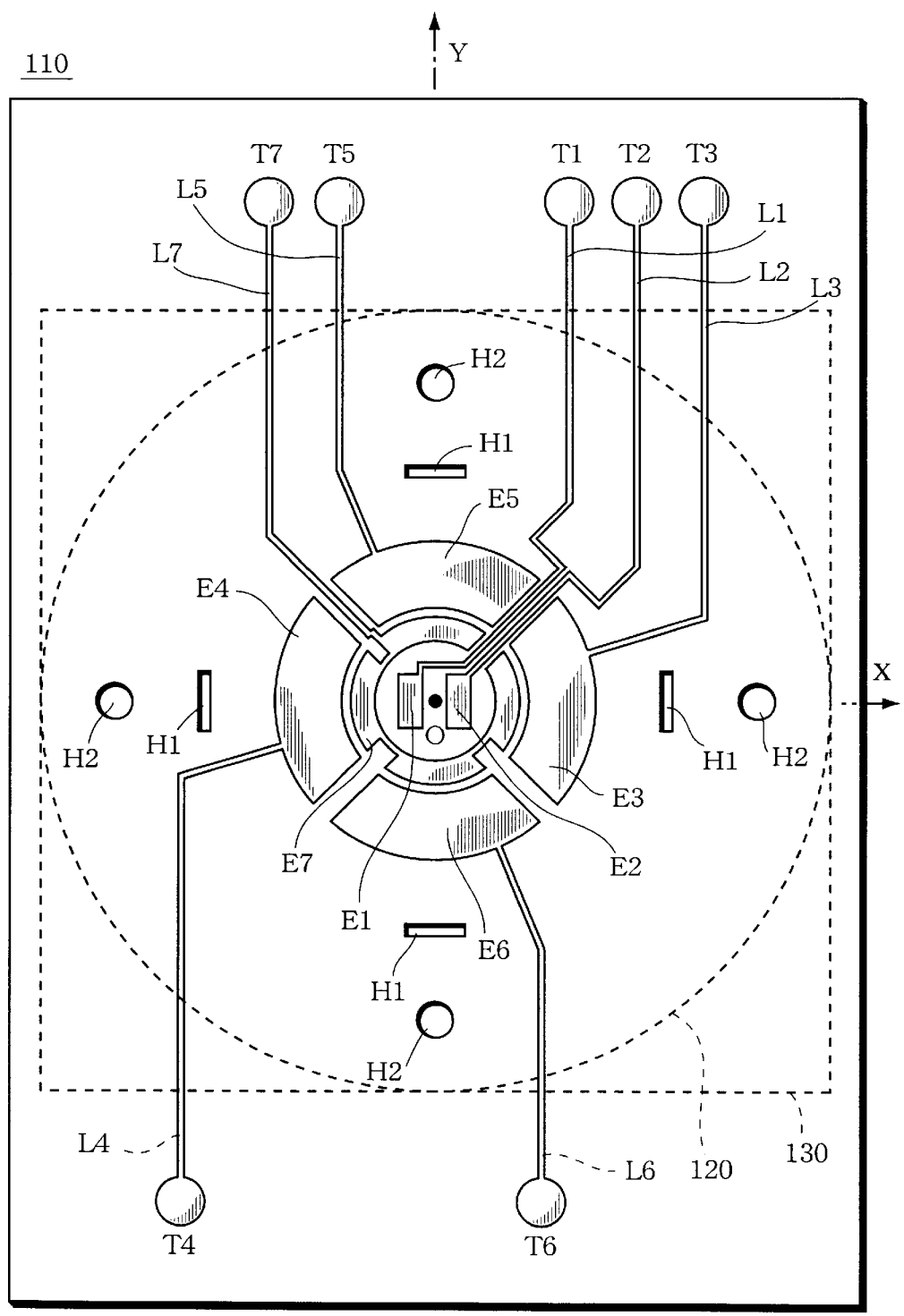
FIG. 2 is a top view illustrating a circuit board 110 of the force sensor shown in FIG. 1. The section taken along the X-axis of the circuit board 110 is shown in FIG. 1.
Figure 3:
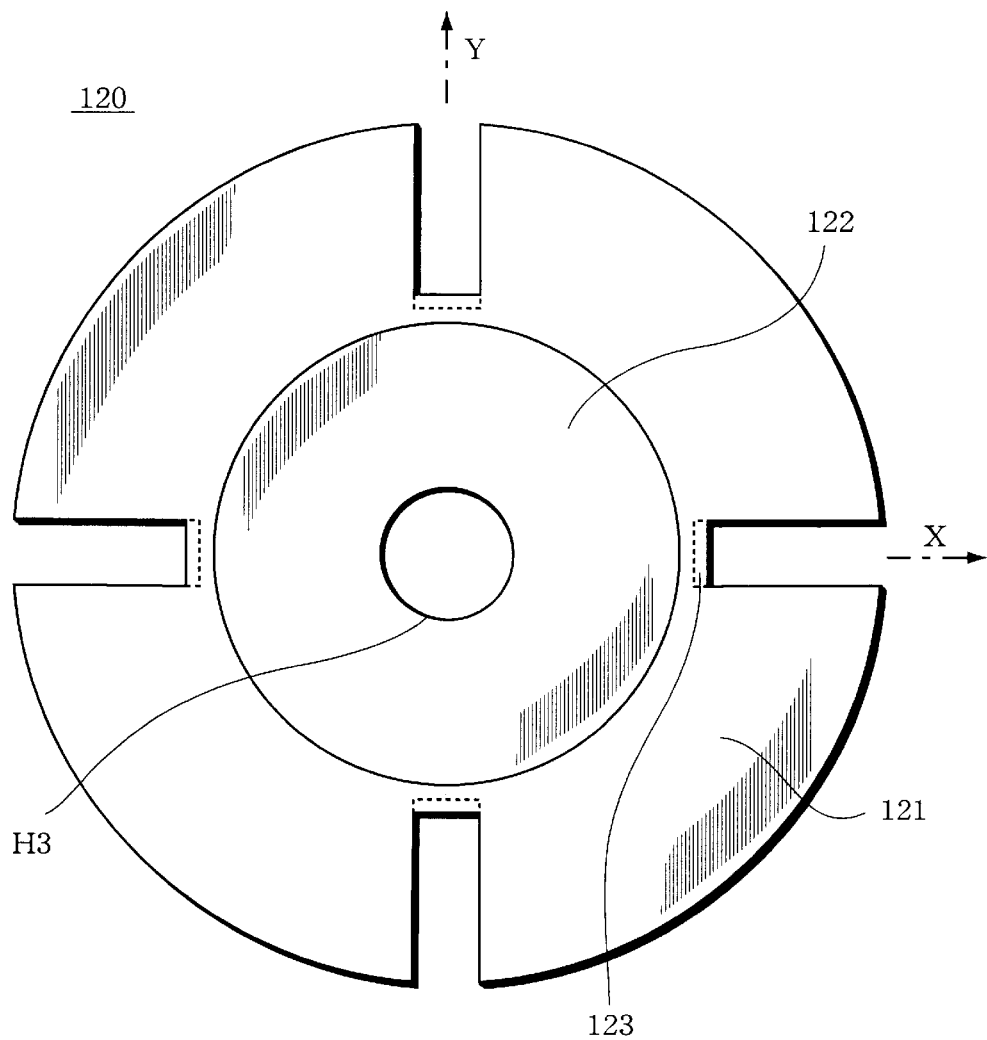
FIG. 3 is a top view illustrating an intermediate displacement board 120 of the force sensor shown in FIG. 1. The section taken along the X-axis of the intermediate displacement board 120 is shown in FIG. 1.
Figure 4:
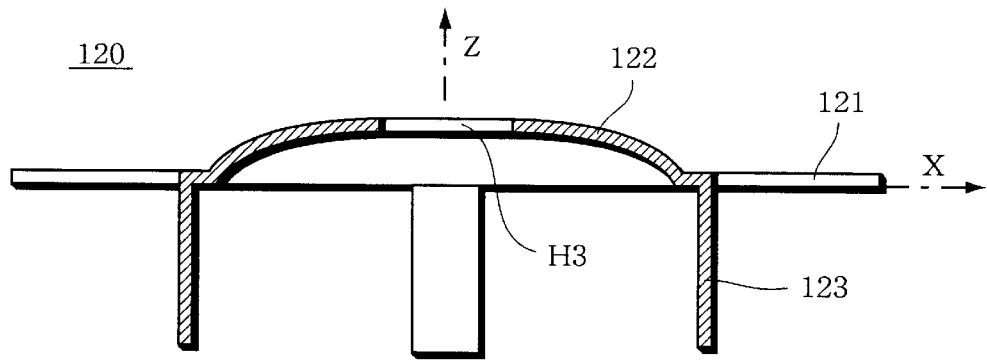
FIG. 4 is a cross-sectional side view illustrating the section taken along the X-axis of the intermediate displacement board 120 shown in FIG. 3.
Figure 5:
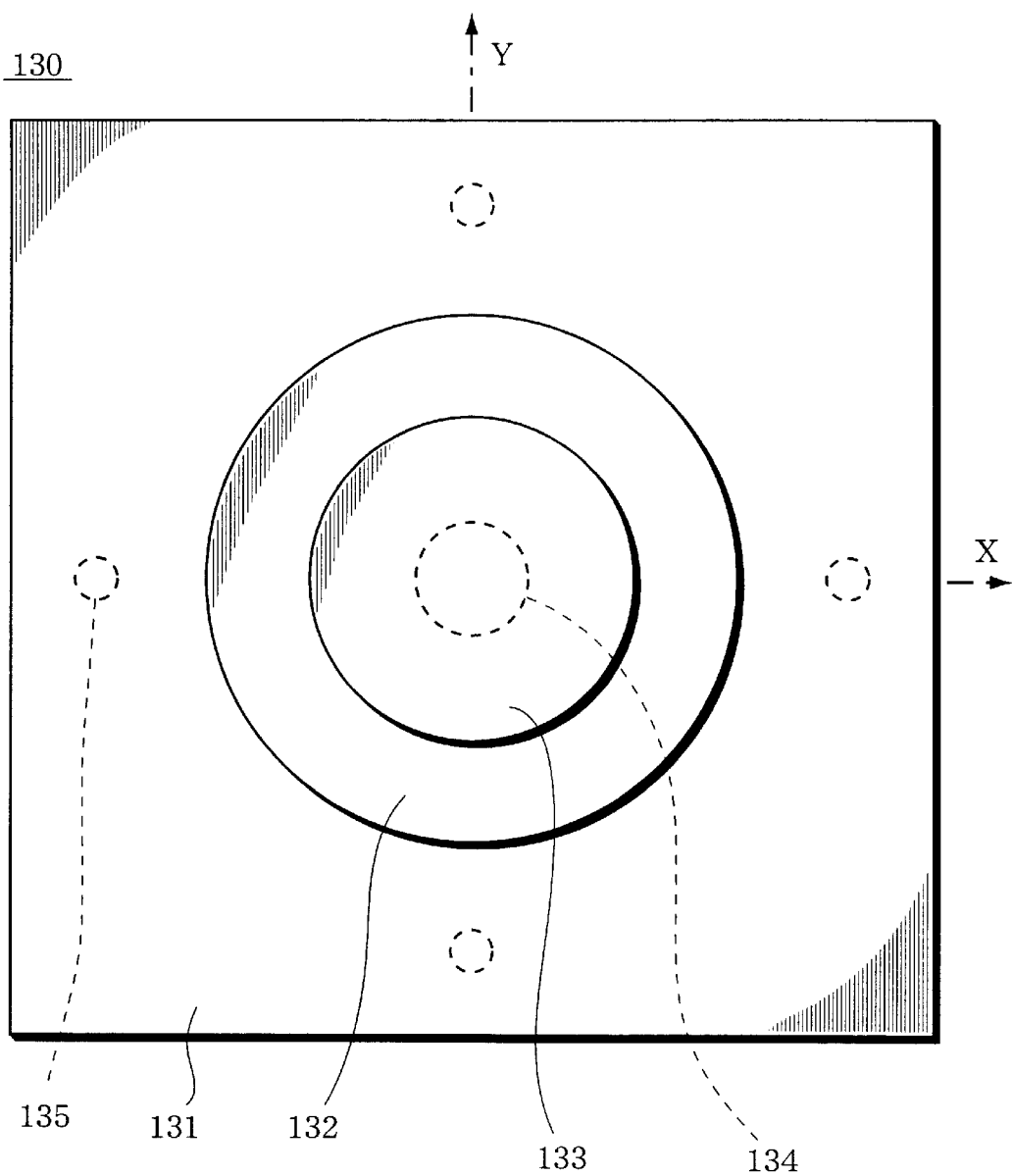
FIG. 5 is a top view illustrating a strain generative body 130 of the force sensor shown in FIG. 1. The section taken along the X-axis of the strain generative body 130 is shown in FIG. 1.

The circuit board 110 is used as a printed circuit board in typical electronic circuits and employs a glass epoxy circuit board in this example. Film circuit boards such as polyimide film may be used as the circuit board 110, however, the film circuit board is flexible and thus preferably arranged on some supportive circuit board having sufficient rigidity. FIG. 2 is a top view of the circuit board 110. For the positional relationship with the cross-sectional side view of FIG. 1, reference should be made to each axis of the coordinate system. The section of the circuit board 110 shown in the top view of FIG. 2 and taken along the X-axis is illustrated in the cross-sectional side view of FIG. 1. In the top view of FIG. 2, for convenience in illustration, a peripheral part of the circuit board 110 is not shown. The circular broken line of FIG. 2 illustrates the position at which the intermediate displacement board 120 is arranged (The top view and the cross-sectional side view of the intermediate displacement board 120 are shown in FIGS. 3 and 4, respectively.). The rectangular broken line of FIG. 2 illustrates the position at which the strain generative body 130 is arranged (The top view of the strain generative body 130 is shown in FIG. 5.).

As shown in FIG. 2, a circuit pattern is printed on the upper surface of the circuit board 110. That is, a pair of electrodes E1, E2 is formed directly adjacent to the origin O, outside of which are formed four sets of sector-shaped electrodes E3, E4, E5, E6, and in the intermediate portion of which is formed a generally annular electrode E7. As will be described later, the electrodes E1, E2 are used for switching the device and are to be hereinafter referred to as the switch securing electrodes. In addition, the electrodes E3-E7 constitute capacitors to be used for detecting forces and are to be hereinafter referred to as the capacitor securing electrodes. More specifically, the capacitor securing electrodes E3, E4 arranged on the X-axis are used for detecting the X-axial component of an applied force and the capacitor securing electrodes E5, E6 arranged on the Y-axis are used for detecting the Y-axial component of the applied force. The capacitor securing electrode E7 generally annular in shape is used for detecting the Z-axial component of the applied force. Wiring layers L1-L7 are conductive layers for electrically connecting each of the electrodes E1-E7 to each of terminals T1-T7 that is adapted to be connected to an exterior electronic circuit. Each of the electrodes E1-E7, each of the wiring layers L1-L7, and each of the terminals T1-T7 are of a conductive pattern formed on the circuit board 110 which can be mass-produced by the conventional typical technology of forming printed circuit boards. In the cross-sectional side view of FIG. 1, the wiring layers L1-L7 and the terminals T1-T7 are not shown to prevent the figure from becoming complicated.

As shown in the top view of FIG. 3, the intermediate displacement board 120 comprises generally circular metal plates. As illustrated in the cross-sectional side view of FIG. 4, the center portion is shaped in the form of a bowl of an upside down bowl. The portion including a mouth of the bowl and the surrounding flat plate of this intermediate displacement board 120 is to be hereinafter referred to as the displacement board securing portion 121. On the other hand, the bowl-shaped portion dilated as such is to be hereinafter referred to as the displacement board displacement portion 122. Displacement board securing claws 123 are formed in the four segments of the intermediate displacement board 120. The displacement board securing claws 123 are each formed of a part of the circular metal plate which is cut and bent downward. As shown in FIG. 2, the circuit board 110 is provided on the upper surface thereof with slit-shaped displacement board securing holes H1 for inserting into the four displacement board securing claws 123. The displacement board securing claws 123 are inserted into the displacement board securing holes H1, thereby allowing the intermediate displacement board 120 to be mounted on the circuit board 110. Incidentally, as will be described later, the circular holes that are provided outside the displacement board securing holes H1 are strain generative body securing holes H2. The intermediate displacement board 120 can be fixed to the circuit board 110 by bending the displacement securing claws 123 at the lower surface of the circuit board 110.

Thus, the intermediate displacement board 120 is mounted on the circuit board 110 in the shape of an upside down bowl. A circular open window H3 is formed on the portion corresponding to the base portion of the bowl as shown in FIG. 4. The intermediate displacement board 120 is fixed on the circuit board 110 by the displacement board securing portion 121. However, the intermediate displacement board 120 can be partially bent and thereby displaced because the intermediate displacement board 120 is made of a flexible plate (in this case, a metal plate) when a physical force is applied to the displacement board displacement portion 122. In particular, the surrounding portion of the open window H3 constitutes a free end, thereby allowing the open window to be displaced sufficiently. The intermediate displacement board 120 configured as such can be readily mass-produced by pressing one piece of metal plate.

On the other hand, the structure of a strain generative body 130 is illustrated in the top view of FIG. 5. The strain generative body 130 shown in this example comprises a secured portion 131, a connecting portion 132, a displacement portion 133, and an elastic deformation portion 134, which can be integrally formed of silicon rubber and thus are also suitable for mass-production. The secured portion 131 is to be fixed on the upper surface of the circuit board 110 and four attachment pins 135 protrude from the lower surface of the secured portion 131. As shown in FIG. 2, the four strain generative body securing holes H2 are provided on the circuit board 110. The four attachment pins 135 are inserted into the four strain generative body securing holes H2, thereby allowing the strain generative body 130 to be fixed on the upper surface of the circuit board 110. The displacement portion 133 is located at the center of the strain generative body 130 and disposed directly above the origin O defined at the center of the circuit board 110 as shown in FIG. 1, thus being subjected to an external force and thereby displaced. The secured portion 131 and the displacement portion 133 are connected via the connecting portion 132. The connecting portion 132 is flexible. Thus, application of a force to the displacement portion 133 causes the connecting portion 132 to be bent, thereby displacing the displacement portion 133 relative to the circuit board 110.

In this example, since the secured portion 131, the connecting portion 132, the displacement portion 133, and the elastic deformation portion 134 are each made of silicon rubber, any of the portions are deflective and elastic. In particular, the connecting portion 132 is thin in order to be the most deflective and is thus apt to be elastically deformed. Incidentally, the terms "flexibility" and "elastic deformation" are herein used as a substantial equivalent and will be used as appropriate depending on which property is observed, flexibility or elastic deformation. Here, the "flexibility" required for the connecting portion 132 means the easiness of deflection to produce, in response to the operation of an operator, a displacement enough to allow the displacement portion 133 to serve as a push-button. On the other hand, as illustrated by broken lines in FIG. 5, the elastic deformation portion 134 is a cylindrical component having the Z-axis as the central axis thereof, and formed on the lower surface of the displacement portion 133. The elastic deformation portion 134 needs to be elastically deformed. Here, the "elastic deformation" required of the elastic deformation portion 134 is to be elastically deformed enough for the operation of the force sensor in response to the operation by the operator.

As shown in FIG. 1, on the bottom surface of the elastic deformation portion 134 is formed an electrode F0. The electrode F0 is arranged opposite to the switch securing electrodes E1, E2 formed on the upper surface of the circuit board 110 and is displaced in conjunction with the displacement of the displacement portion 133. Thus, the electrode F0 will be referred to as the switch displacement electrode. In this example, the switch displacement electrode F0 is made of conductive rubber but may be formed of conductive ink layer to further reduce the manufacturing cost.

Incidentally, in the example shown here, the entire strain generative body 130 is formed of one piece of silicon rubber. In terms of function, however, the three portions of the strain generative body 130, that is, the secured portion 131, the connecting portion 132, the displacement portion 133 serve to generate displacement. Therefore, the term "acting body" is to be used to collectively name the three portions. That is, the acting body comprises three portions, the secured portion 131, the connecting portion 132, and the displacement portion 133. Accordingly, the acting body and the elastic deformation portion 134 constitute the strain generative body 130.

As shown in FIG. 1, in the force sensor according to the first embodiment, on the circuit board 110 is arranged the intermediate displacement board 120 on which the strain generative body 130 is arranged, which are eventually mounted on the circuit board 110 with the attachments 140. In other words, an acting body having a bowl-shaped portion (132, 133) is first prepared and then mounted upside down on the upper surface of the circuit board 110. Here, the portion corresponding to the bottom portion of the bowl is to be used as the displacement portion 133. In addition, the portion corresponding to the side portion of the bowl is to be used as the connecting portion 132 and the mouth portion and the surrounding portion of the bowl are to be used as the secured portion 131. Moreover, the elastic deformation portion 134 is disposed at such a position as to penetrate the open window H3 provided exactly on the intermediate displacement board 120. That is, the open window H3 is formed with a size sufficient to prevent the elastic deformation portion 134 from being displaced.

§2. Operation of the First Embodiment

Now, the operation of the force sensor according to the first embodiment is described. This device can operate in two ways, that is, as the push-button switch that senses the operational ON/OFF input and as the three-dimensional force sensor capable of recognizing the magnitude of each axial component of an applied force. The structure shown in FIG. 1 illustrates the displacement portion 133 to which no force is applied. Under this condition, suppose that an operator applies a depressive force to the displacement portion 133 downwards toward the circuit board 110 (a force in the negative Z-axis direction). In this case, as shown in the cross-sectional side view of FIG. 6, the connecting portion 132 is elastically deformed to be deflected, while the displacement portion 133 is displaced downward in conjunction with the elastic deformation portion 134. Then, the switch displacement electrode F0 formed on the bottom surface of the elastic deformation portion 134 comes into contact with a pair of the switch securing electrodes E1, E2 formed on the upper surface of the circuit board 110. Here, suppose that the operator further applies a depressive force (a force in the negative Z-axis direction) to the displacement portion 133 to push the portion further downwards. In this case, the elastic deformation portion 134 is elastically deformed to be crushed as shown in the cross-sectional side view in FIG. 7. Consequently, this causes the displacement portion 133 to be displaced further downwards. Then, the deformation portion of the connecting portion 132 (or the bottom surface of the displaced displacement portion 133) comes into physical contact with the intermediate displacement board 120, thereby displacing the displacement board displacement portion 122 downwards.

Suppose that the elastic deformation of the connecting portion 132 is apt to be made in comparison with that of the elastic deformation portion 134 (specifically speaking, the connecting portion 132 may be made thinner as shown in the figure). In this case, the operator would feel the aforementioned depressing operation as a two-stage operation. That is, in the first-stage operation, the displacement portion 133 is depressed with a relatively weak force in the same manner as a conventional typical push-button switch and the switch is turned ON. This operation provides the operator with a relatively long stroke and favorable click feeling. The first-stage operation causes the connecting portion 132 to be deflected, thereby causing the structure of the device to change from the position shown in FIG. 1 to the one shown in FIG. 6. The second-stage operation corresponds to the operation of further depressing the displacement portion 133 with a stronger force after the press-button switch has been turned to ON. This operation requires a small stroke, producing no click feeling. The second-stage operation causes the elastic deformation portion 134 to be elastically deformed and crushed, also causing the structure of the device to be changed from the position shown in FIG. 6 to the one shown in FIG. 7.

Figure 7:
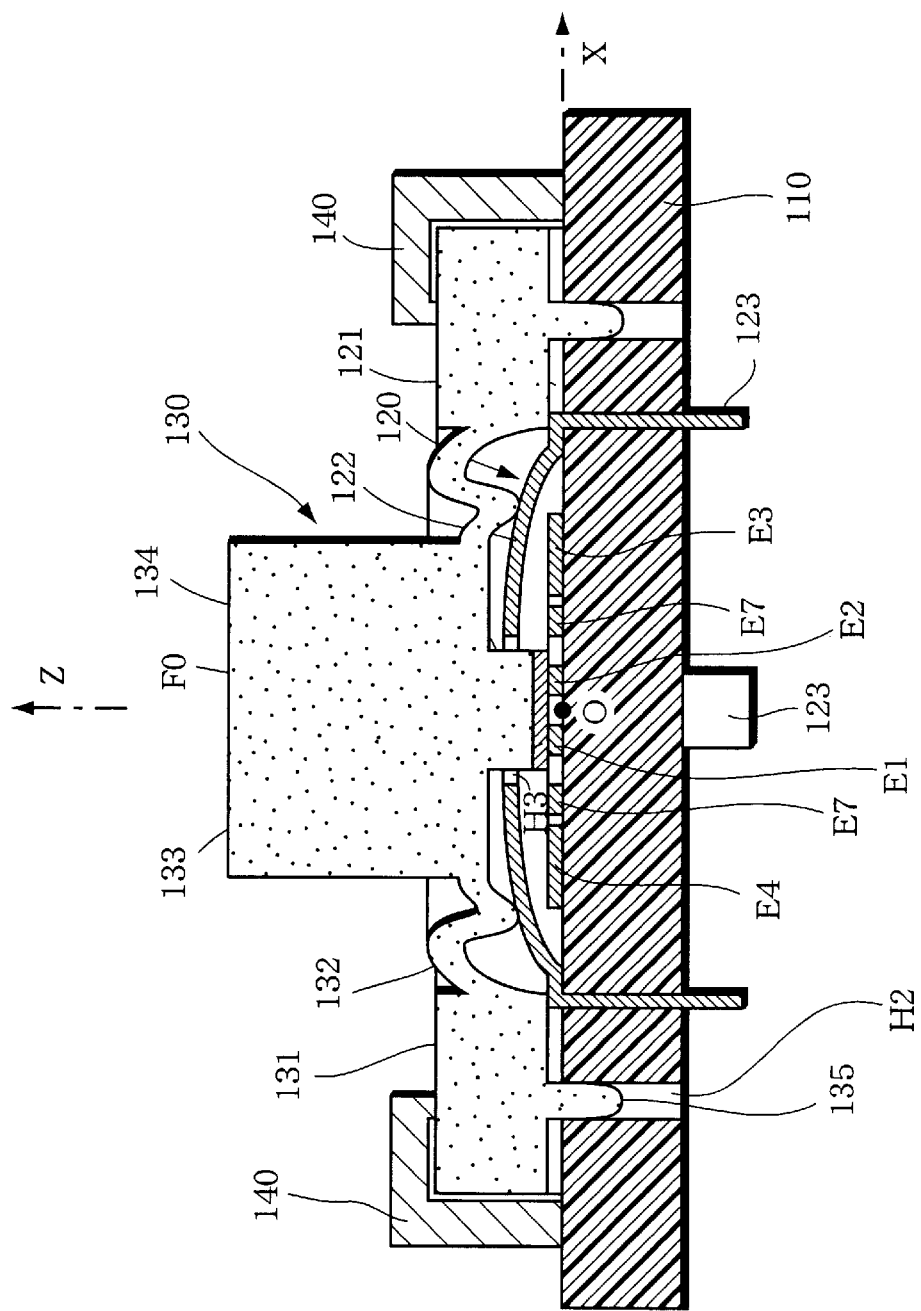
FIG. 7 is a cross-sectional side view, shown along the X-axis, illustrating an elastic deformation portion 134 to which a greater force than that in the condition described in FIG. 6 is applied in the negative Z-axis direction. The elastic deformation can be used to detect the force in the Z-axis direction.
Figure 8:
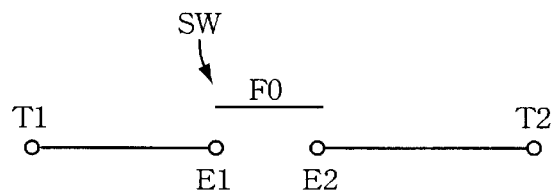
FIGS. 8a and 8b are circuit diagrams illustrating the equivalent circuit of the force sensor shown in FIG. 1.
Figure 8:
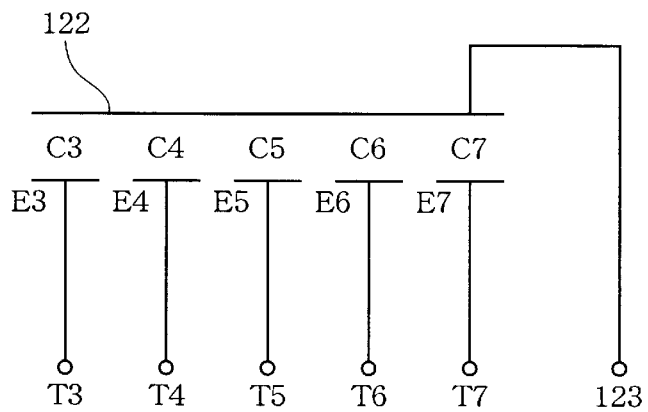

FIGS. 8a and 8b are circuit diagrams illustrating equivalent circuits of the force sensor according to the first embodiment. FIG. 8a illustrates the equivalent circuit of a portion involved with operation of a push-button switch for detecting the operational ON/OFF input, the equivalent circuit being operated by the aforementioned first-stage operation. That is, the switch securing electrodes E1, E2 are electrically isolated from each other under the condition shown in FIG. 1, thereby causing the terminals T1, T2 to be isolated from each other. However, suppose that a predetermined amount of force is applied to the displacement portion 133 in the Z-axis direction (the negative Z-axis direction if the sign is taken into account). In this case, the displacement portion 133 turns into the state shown in FIG. 6 (or likewise into the state shown in FIG. 7), causing the switch displacement electrode F0 to come into contact with the switch securing electrodes E1, E2. This makes a short-circuit between the switch securing electrodes E1, E2 and conductive between the terminals T1, T2. Eventually, a displacement in the vertical direction of the displacement portion 133 corresponds to the ON/OFF operation of the switch SW in the circuit shown in FIG. 8a. Thus, monitoring the conductive state between the terminals T1, T2 by means of an exterior circuit allows the detection of the operational ON/OFF input.

On the other hand, FIG. 8b illustrates an equivalent circuit of a portion involved with the operation of a three-dimensional force sensor to recognize the magnitude of each axial component of a force applied to the displacement portion 133. The equivalent circuit is mainly operated by the aforementioned second-stage operation. As shown in FIG. 2, five capacitor securing electrodes E3-E7 are formed on the circuit board 110. Above these electrodes, the displacement board displacement portion 122 made of a metal plate is arranged opposite to these electrodes. Thus, as shown in the equivalent circuit of FIG. 8b, five sets of capacitors C3-C7 are formed. Here, the displacement board displacement portion 122 is to be referred to as the capacitor displacement electrode. The capacitors C3-C7 are to be constituted by a common capacitor displacement electrode (displacement board displacement portion 122) and the discrete capacitor securing electrodes E3-E7. The capacitance of each of the capacitors C3-C7 can be measured independently as capacitance between the displacement board securing claws 123 and each of the terminals T3-T7, respectively.

As shown in FIG. 7, when the second-stage operation described above is carried out, the displacement board displacement portion 122 is displaced downward due to the deformation of the connecting portion 132 (or due to the displacement of the displacement portion 133). This causes a change in spacing between the electrodes of capacitors C3-C7, thereby changing each capacitance. Thus, the capacitors C3-C7 are configured so that the capacitance thereof is changed in response to the displacement of the displacement portion 133. With this second-stage operation, no change occurs in the equivalent circuit shown in FIG. 8a, causing the switch SW to remain in a closed state (an ON state). On the other hand, in the equivalent circuit shown in FIG. 8b, a change occurs to the capacitance of each of the capacitors C3-C7. Through the detection of the change, each axial component of an applied force (the X, Y and Z-axial components) can be determined independently. Although detailed in each of the above-mentioned publications, the principle is repeatedly explained below.

First, in the second-stage operation, suppose that a force Fx is applied in the positive X-axis direction. Here, the second-stage operation is carried out on the precondition that the switch displacement electrode F0 and the switch securing electrodes E1, E2 remain in contact with each other. Therefore, a force −Fz is also kept applied in the negative Z-axis direction when the second-stage operation is carried out. Thus, the operator should depress the push-button switch (the first-stage operation) and thereafter further applies a force Fx in the positive X-axis direction (this usually accompanies an operation to further increase a force −Fz in the negative Z-axis direction). Applying a force Fx in the positive X-axis direction as such will cause the positive X-axis portion of the displacement board displacement portion 122 to be displaced downward more greatly than the negative X-axis portion is displaced downward. Consequently, the spacing between the electrodes of the capacitor C3 becomes smaller than that of the capacitor C4. Therefore, this causes the capacitance of the capacitor C3 to become greater than that of the capacitor C4. Now, each capacitance is expressed with the same symbol as that of each capacitor, thereby making it possible to determine the magnitude of a force applied in the positive X-axis direction based on a difference operation "C3−C4". On the contrary, applying a force −Fx in the negative X-axis direction would cause the relationship of magnitude between the values of capacitance is reversed. Eventually, with the difference that resulted from the operation "C3−C4", the sign thereof indicates either the positive or negative direction, while the absolute value thereof indicates the magnitude of the X-axial component of the force.

This also holds true for the Y-axis. Thus, the direction and magnitude of a force ±Fy applied in the Y-axis direction can be determined based on a difference "C5−C6" in capacitance between the capacitors C5, C6. That is, the first capacitor C3 arranged above the positive X-axis and the second capacitor C4 arranged above the negative X-axis allow the direction and magnitude of the X-axial component of the applied force to be determined, based on the difference in capacitance between a pair of the capacitors. Likewise, the third capacitor C5 arranged above the positive Y-axis and the fourth capacitor C6 arranged above the negative Y-axis allow the direction and magnitude of the Y-axial component of the applied force to be determined, based on the difference in capacitance between a pair of capacitors.

Figure 6:
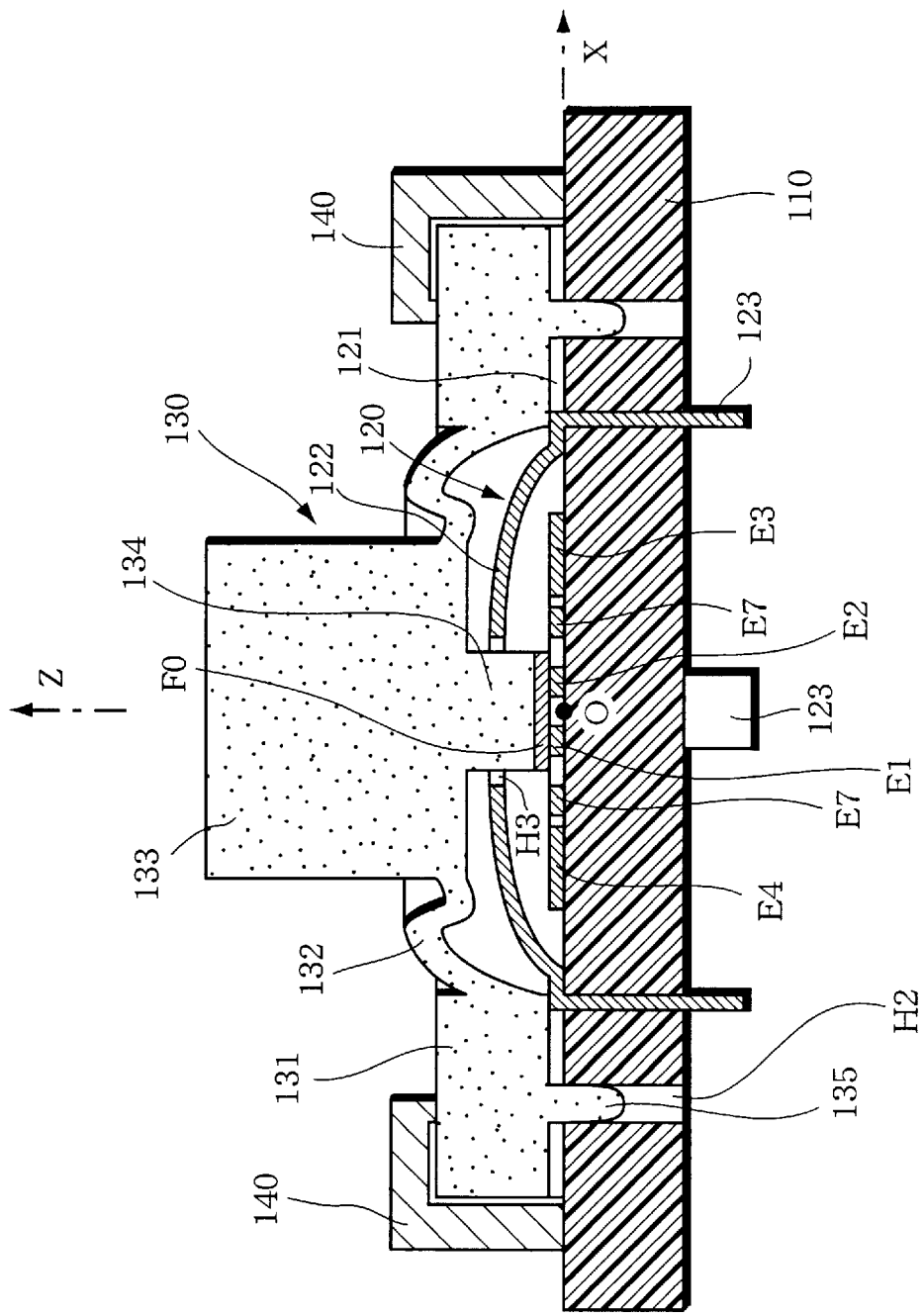
FIG. 6 is a cross-sectional side view, shown along the X-axis, illustrating a displacement portion 133 of the force sensor shown in FIG. 1, to which a force directed in the negative Z-axis direction is applied and the ON state of the operational input is given.

On the other hand, a forces applied in the Z-axis direction can be determined with the capacitance C7 of the capacitor C7. The force sensor according to the present invention is based on the precondition that the operator applies a depressing force downward to the displacement portion 133 to carry out the operational input. Thus, the force applied in the Z-axis direction is inevitably a force −Fz directed in the negative direction. Since a force −Fz of a certain magnitude has been applied thereto through the first-stage operation, the switch displacement electrode F0 is in contact with the switch securing electrodes E1, E2 as shown in FIG. 6. However, the force in the Z-axis direction to be determined by the capacitor C7 is a force that is further applied in the Z-axis direction from the state shown in FIG. 6 to create the state shown in FIG. 7. As shown in FIG. 7, such an additional force applied in the negative Z-axis direction will cause the displacement board displacement portion 122 to be uniformly displaced downward, reducing the spacing between the electrodes of the capacitor C7 and thereby increasing the capacitance C7. Therefore, the magnitude of a force applied in the negative Z-axis direction can be determined, based on the capacitance C7.

Eventually, in the equivalent circuit shown in FIG. 8b, monitoring the capacitance of the displacement board claws 123 and each of the terminals T3-T7 by means of an exterior circuit allows the components of force in all the XYZ-axis directions to be detected. Incidentally, in order to prevent a value of the other axial components from interfering with the result of detection, each of the capacitor securing electrodes E3-E7 is preferably shaped as follows. First, as shown in FIG. 2, the capacitor securing electrodes E3, E4 are preferably formed symmetrically with respect to the X-axis. This arrangement will allow the influence of the Y-axis component of the force to be cancelled out. (The difference operation cancels out the influence of the Z-axis component of the force.) Likewise, as shown in FIG. 2, the capacitor securing electrodes E5, E6 are preferably formed symmetrically with respect to the Y-axis. This arrangement will also allow the influence of the X-axis component of the force to be cancelled out. (The difference operation cancels out the influence of the Z-axis component of the force.) In addition, as shown in FIG. 2, the capacitor securing electrode E7 is also preferably formed symmetrically with respect to both the X and Y-axes. This arrangement will also allow the influence of the X-axis and Y-axis component of the force to be cancelled out. However, in practice, wiring layers or the like have to be provided and thus it is often difficult to make the electrodes perfectly symmetrical. Therefore, in reality, it is sufficient to design the electrodes to be as symmetrically as possible.

As described above, the force sensor according to this embodiment makes it possible to recognize the direction and magnitude of XYZ three-dimensional components of an applied force, while serving as a push-button switch that detects the operational ON/OFF input. That is, an operation performed as the first-stage operation by the operator to depress the displacement portion 133 downward will realize an operational ON/OFF input with a sufficient stroke and favorable click feeling. The ON/OFF state can be detected in terms of the conductive state between the terminals T1, T2 in the equivalent circuit shown in FIG. 8a. As the second-stage operation, suppose that the operator applies a depressive force further downward or simultaneously applies a depressive force sideward (in the direction of X- or Y-axis) in this state. In this case, the component of each of the axes of the depressive force in question can be detected, based on the capacitance of each of the capacitors in the equivalent circuit shown in FIG. 8b.

§3. Variants of the First Embodiment

Figure 9:
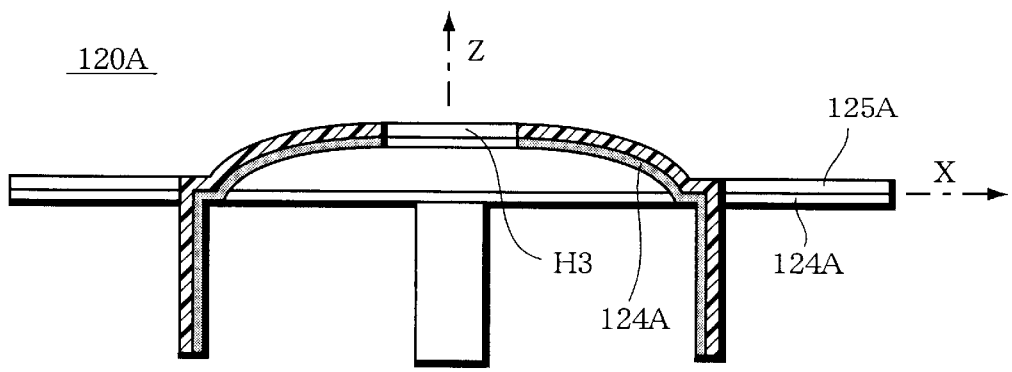
FIG. 9 is a cross-sectional side view, shown along the X-axis, illustrating an intermediate displacement board 120A which is a variation of the intermediate displacement board 120 shown in FIG. 4.

Some of the variants of the first embodiment described above will now be described. In the above-mentioned embodiment, a portion (the displacement board displacement portion 122) of the intermediate displacement board 120, which is comprised of a metal material, is directly used as the capacitor displacement electrode. However, it is not always necessary to form the intermediate displacement board 120 of a metal plate. FIG. 9 is a cross-sectional side view illustrating an example of an intermediate displacement board 120A made of synthetic resin material. In this example, a base structure 125A is made of synthetic resin material such as PET or polyimide and a metal layer 124A is formed on the lower surface thereof to form the intermediate displacement board 120A. The base structure 125A itself has an insulating body but the metal layer 124A formed on the lower surface serves as the capacitance displacement electrode. Synthetic resin materials such as PET or polyimide can provide reduced cost and facilitate manufacturing, thus being suitable for mass-production. The metal layer 124A can be easily formed by the deposition of metal such as aluminum. PET films having metal layers already deposited thereon are also commercially available. Thus, using such a material available in the market will allow the intermediate displacement board 120A having such a structure as shown in FIG. 9 to be obtained merely by pressing.

Figure 10:
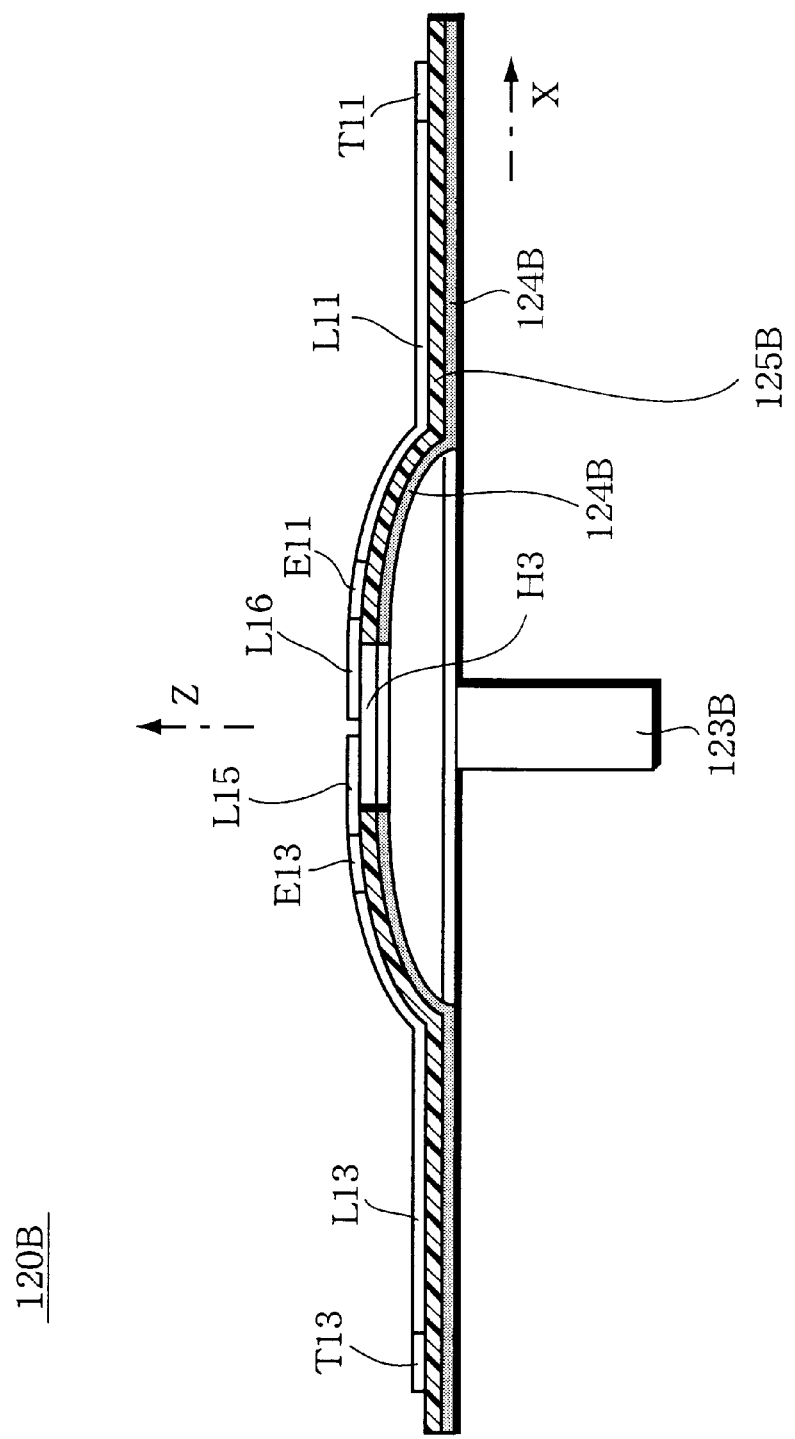
FIG. 10 is a cross-sectional side view, shown along the X-axis, illustrating an intermediate displacement board 120B which is another variation of the intermediate displacement board 120 shown in FIG. 4.
Figure 1:
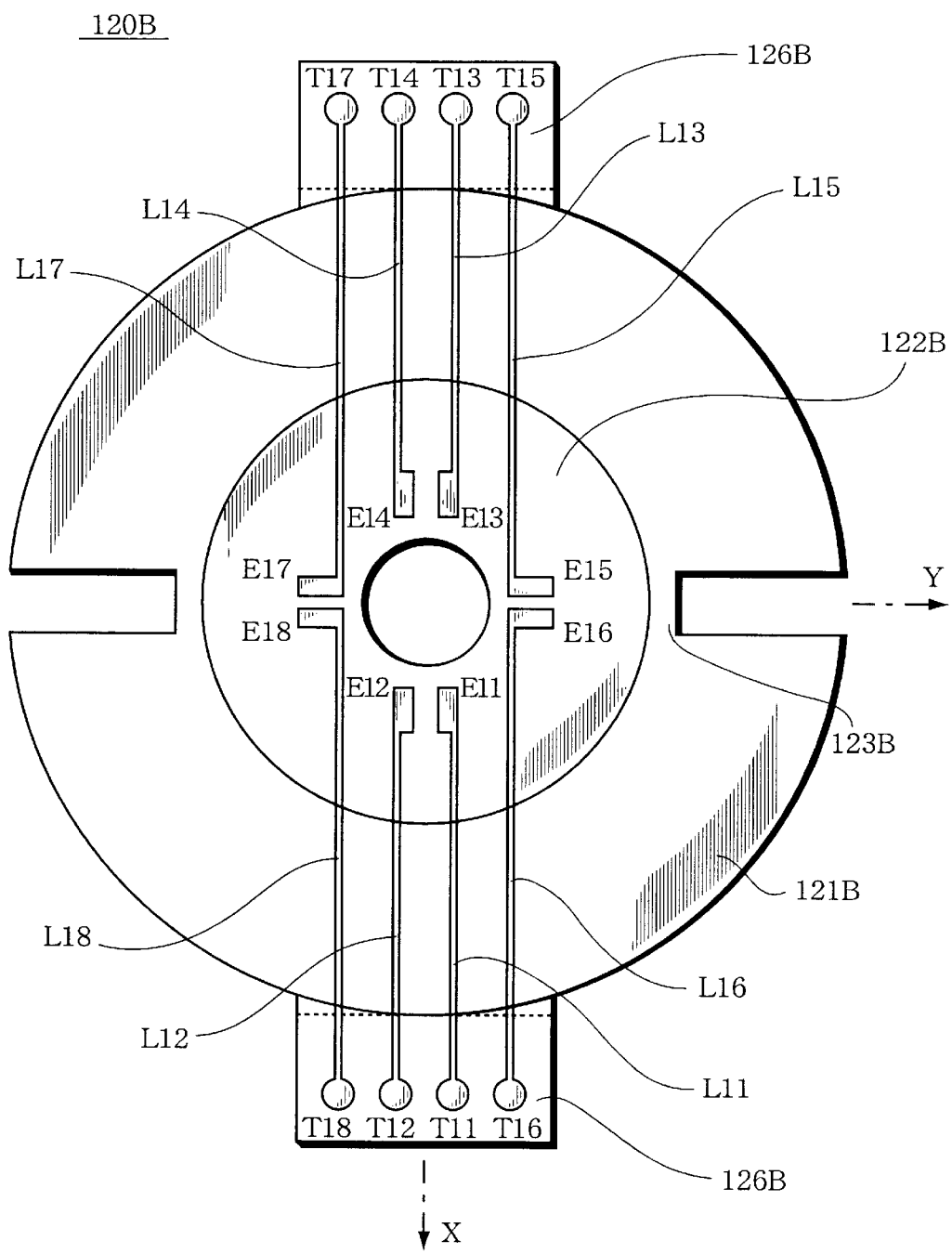

The intermediate displacement board 120B shown in FIG. 10 includes a base structure 125B which is also made of a synthetic material such as PET or polyimide and on the lower surface of which formed is a metal layer 124B, and is used as the capacitor displacement electrode. In addition, on the upper surface thereof, a group of electrodes that are made of a metal layer is formed. FIG. 11 is a top view illustrating the intermediate displacement board 120B. Substantially like the intermediate displacement board 120 shown in FIG. 3, the intermediate displacement board 120B has a surrounding displacement board securing portion 121B and a bowl-shaped displacement board displacement portion 122B, being mounted on the circuit board by displacement board securing claws 123B. On the both ends thereof, wiring portions 126B are formed and terminals T11-T18 are arranged. As shown in the figure, eight electrodes E11-E18 are formed on the displacement board displacement portion 122B. Here, these electrodes will be referred to as the first additional switch electrodes. The first additional switch electrodes E11-E18 are connected to the terminals T11-T18 through wiring layers L11-L18, respectively. Each of these electrodes, wiring layers, and terminals can be formed on the base structure 125B by the technique of screen-printing. The cross-sectional side view of FIG. 10 illustrates the intermediate displacement board 120B of FIG. 11, taken along the X-axis.

Figure 12:
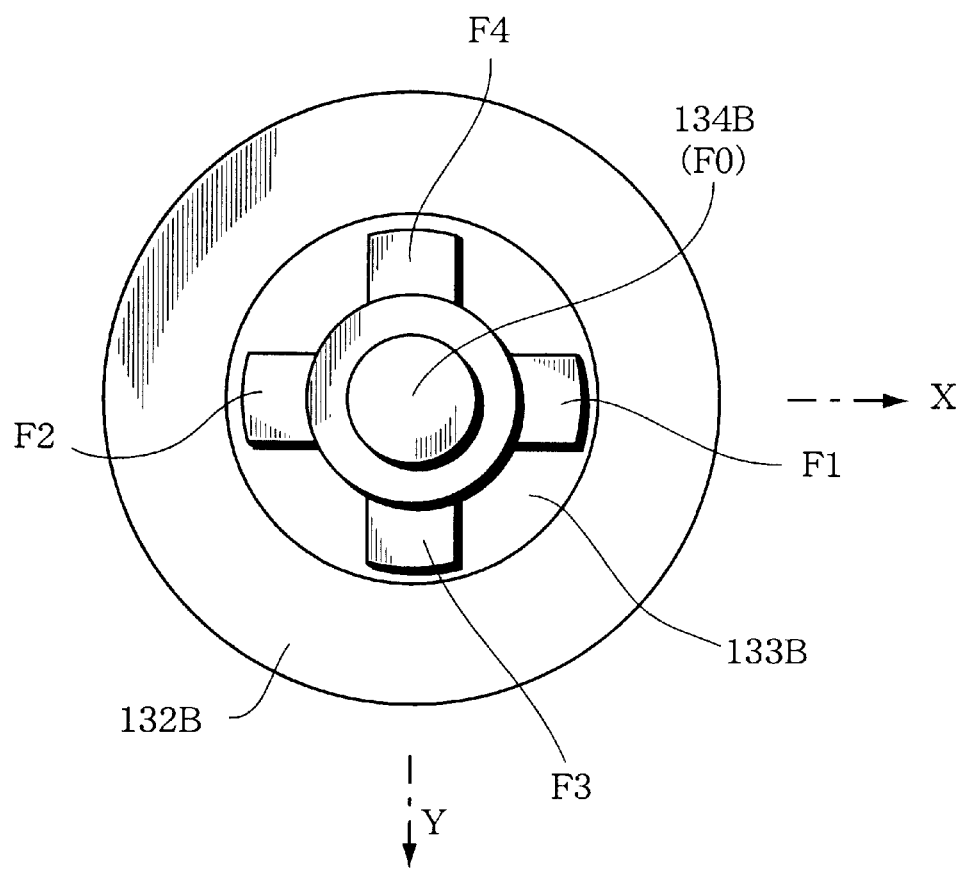
FIG. 12 is a bottom view illustrating the center portion of a strain generative body 130B used in conjunction with the intermediate displacement board 120B shown in FIG. 10.
Figure 13:
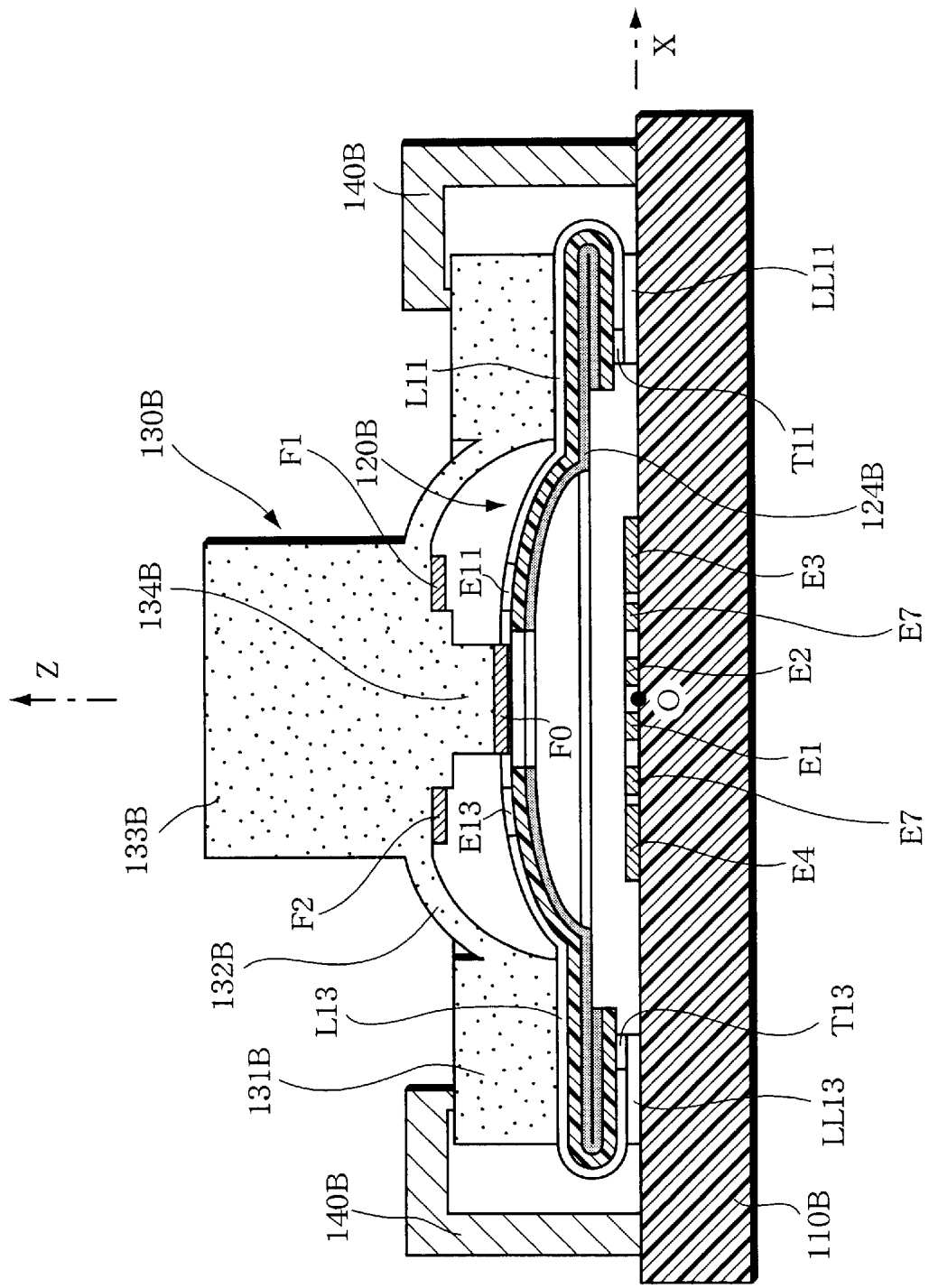
FIG. 13 is a cross-sectional side view illustrating a force sensor using the intermediate displacement board 120B shown in FIG. 10 and the strain generative body 130B shown in FIG. 12, each taken along the X-axis.

Use of such an intermediate displacement board 120B requires a strain generative body 130B that corresponds thereto. FIG. 12 is a bottom view illustrating the center portion of the strain generative body 130B. Since the strain generative body 130B has almost the same structure as the strain generative body 130 shown in FIG. 5, only an inward portion of a connecting portion 132B is illustrated in FIG. 12 for convenience in illustration. FIG. 13 is a cross-sectional side view illustrating a force sensor employing the intermediate displacement board 120B as shown in FIGS. 10 and 11, and the strain generative body 130B as shown in FIG. 12. As shown clearly in FIG. 13, the overall structure of the strain generative body 130B is almost the same as the strain generative body 130 described above. That is, a secured portion 131B or a surrounding portion of the strain generative body 130B is fixed to the circuit board 110B, with a center displacement portion 133B being supported by the flexible connecting portion 132B. A cylindrical elastic deformation portion 134B is formed on the lower surface of the displacement portion 133B and a switch displacement electrode F0 is formed on the lower surface of the elastic deformation portion 134B. However, on the lower surface of the displacement portion 133B are formed a step and four electrodes F1-F4, which is different from the aforementioned strain generative body 130 in this respect. The four electrodes F1-F4 are arranged as shown in the bottom view of FIG. 12. Here, the four electrodes F1-F4 are to be referred to as the second additional switch electrodes. The second additional switch electrodes F1-F4 may be made of any conductive material but, in practice, they may be formed of conductive rubber or conductive ink in the same manner as the switch displacement electrode F0.

On the other hand, as shown in the cross-sectional side view of FIG. 13, the intermediate displacement board 120B is arranged on the circuit board 110B with the both ends of the wiring portions 126B being folded back. On the circuit board 110B wiring layers LL11-LL16 are formed at a position in contact with the terminals T11-T16 (Only the wiring layers LL11, LL13 are shown in FIG. 13.). Eventually, the first eight additional switch electrodes E11-E18 shown in FIG. 11 are to be connected to the wiring layers LL11-LL18 formed on the upper surface of the circuit board 110B through the wiring layers L11-L18 and the terminals T11-T18. The metal layer 124B formed on the lower surface of the intermediate displacement board 120B is also connected to a predetermined wiring layer of the circuit board 110B (not shown in FIG. 13). The intermediate displacement board 120B mounted on the circuit board 110B and the strain generative body 130B arranged on top of the intermediate displacement board 120B are fixed by means of attachments 140B.

The basic operation of the force sensor having such an arrangement is identical with the force sensor shown in FIG. 1. That is, it is made possible to detect the ON/OFF operation by the contact state between the switch securing electrodes E1, E2 formed on the circuit board 110B and the switch displacement electrode F0. It is also made possible to detect each axial component of a force by the capacitors C3-C7 which comprise the capacitor securing electrodes E3-E7 formed on the circuit board 110B and the metal layer 124B serving as the capacitor displacement electrode.

However, in this variant, four additional switches are provided. It is thus made possible to detect an independent operational input based on the information from the additional switches. That is, the comparison of the first eight additional switch electrodes E11-E18 shown in FIG. 11 with the four second additional switch electrodes F1-F4 shown in FIG. 12 shows that combinations of the electrodes opposite to each other are formed. By electrically detecting the contact state of these opposing first and second electrodes, additional information can be obtained with respect to the force applied on the displacement portion 133B. Specifically, suppose that the intermediate displacement board 120B and the strain generative body 130B are arranged opposite to each other with both the XY axes of FIG. 11 and both the XY axes of FIG. 12 being aligned with each other. In this case, it can be seen that a pair of the first electrodes E11, E12 is arranged opposite to the second electrode F1. Similarly, a pair of the first electrodes E13, E14 is arranged opposite to the second electrode F2; a pair of the first electrodes E15, E16 is arranged opposite to the second electrode F3; and a pair of the first electrodes E17, E18 is arranged opposite to the second electrode F4. These counter electrodes constitute the additional switches, respectively.

Now, suppose that the additional switch located above the positive X-axis (the switch which consists of the electrodes E11, E12, F1) is turned ON (i.e., the terminals T11, T12 are made conductive therebetween). In this case, it is possible to detect that a force Fx greater in magnitude than a predetermined one has been applied in the positive X-axis direction. Now, suppose that the additional switch located above the negative X-axis (the switch which consists of the electrodes E13, E14, F2) is turned ON (i.e., the terminals T13, T14 are made conductive therebetween). In this case, it is possible to detect that a force −Fx greater in magnitude than a predetermined one has been applied in the negative X-axis direction. Similarly, suppose that the additional switch located above the positive Y-axis (the switch which consists of the electrodes E15, E16, F3) is turned ON (i.e., the terminals T15, T16 are made conductive therebetween) In this case, it is possible to detect that a force Fy greater in magnitude than a predetermined one has been applied in the positive Y-axis direction. Moreover, suppose that the additional switch located above the negative Y-axis (the switch which consists of the electrodes E17, E18, F4) is turned ON (i.e., the terminals T17, T18 are made conductive therebetween). In this case, it is possible to detect that a force −Fy greater in magnitude than a predetermined one has been applied in the negative Y-axis direction.

Incidentally, in the additional switches mentioned above, in a set of the counter electrodes that constitutes the additional switch, one electrode comprises a single electrode layer and the other electrode comprises a pair of electrode layers that are electrically independent of each other. Therefore, if the conductive state between the pair of the electrode layers is electrically detected, it is enable to detect the contact state of the counter electrodes. For example, in the case of the additional switch that consists of the electrodes E11, E12, F1, one electrode comprises the single electrode layer F1 and the other electrode comprises a pair of the electrode layers E11, E12 that are electrically independent of each other. If the conductive state between the pair of the electrode layers E11, E12 is electrically detected, detection of the contact state of the counter electrodes is made. This arrangement is to allow wiring layer to be provided only on one side. That is, in the example of the additional switch described above, wiring is required only for the electrodes E11-E18 on the side of the intermediate displacement board 120B shown in FIG. 11. Thus, no wiring is required for the electrodes F1-F4 on the side of the strain generative body 130B shown in FIG. 12.

This holds true for the relationship between the switch securing electrodes E1, E2 for detecting the ON/OFF operation input and the switch displacement electrode F0. That is, in any one of the embodiments mentioned here, the switch displacement electrode F0 comprises a single electrode layer and the switch securing electrodes E1, E2 comprise a pair of electrode layers that are electrically independent of each other. Thus, the conductive state between the switch securing electrodes E1, E2 is electrically detected, thereby enabling the detection of the conductive state between the switch displacement electrode F0 and the switch securing electrodes E1, E2. Therefore, wiring is required only for the switch securing electrodes E1, E2 (i.e., for the circuit board) and no wiring is required for the switch displacement electrode F0 (i.e. for the strain generative body).

As mentioned above, wiring can be easily formed as a printed pattern on the side of the circuit board, whereas no wiring is preferably provided on the side of the strain generative body as much as possible. This is because each portion of the latter side is displaced and deformed. The arrangement of the electrodes as described above is highly suitable for such a situation. As a matter of course, the aforementioned arrangement is not necessarily essential to implement the present invention. For example, only the electrode E1 may be provided on the side of the circuit board as the switch securing electrode and only the electrode F0 may be provided on the side of the strain generative body as the switch displacement electrode, each electrode being provided with wiring. Thus, it is possible to directly observe the conductive state of both the electrodes. However, in practice, it is preferable to adopt the arrangement of the electrode described above to eliminate wiring.

§4. Configuration of the Second Embodiment

Figure 14:
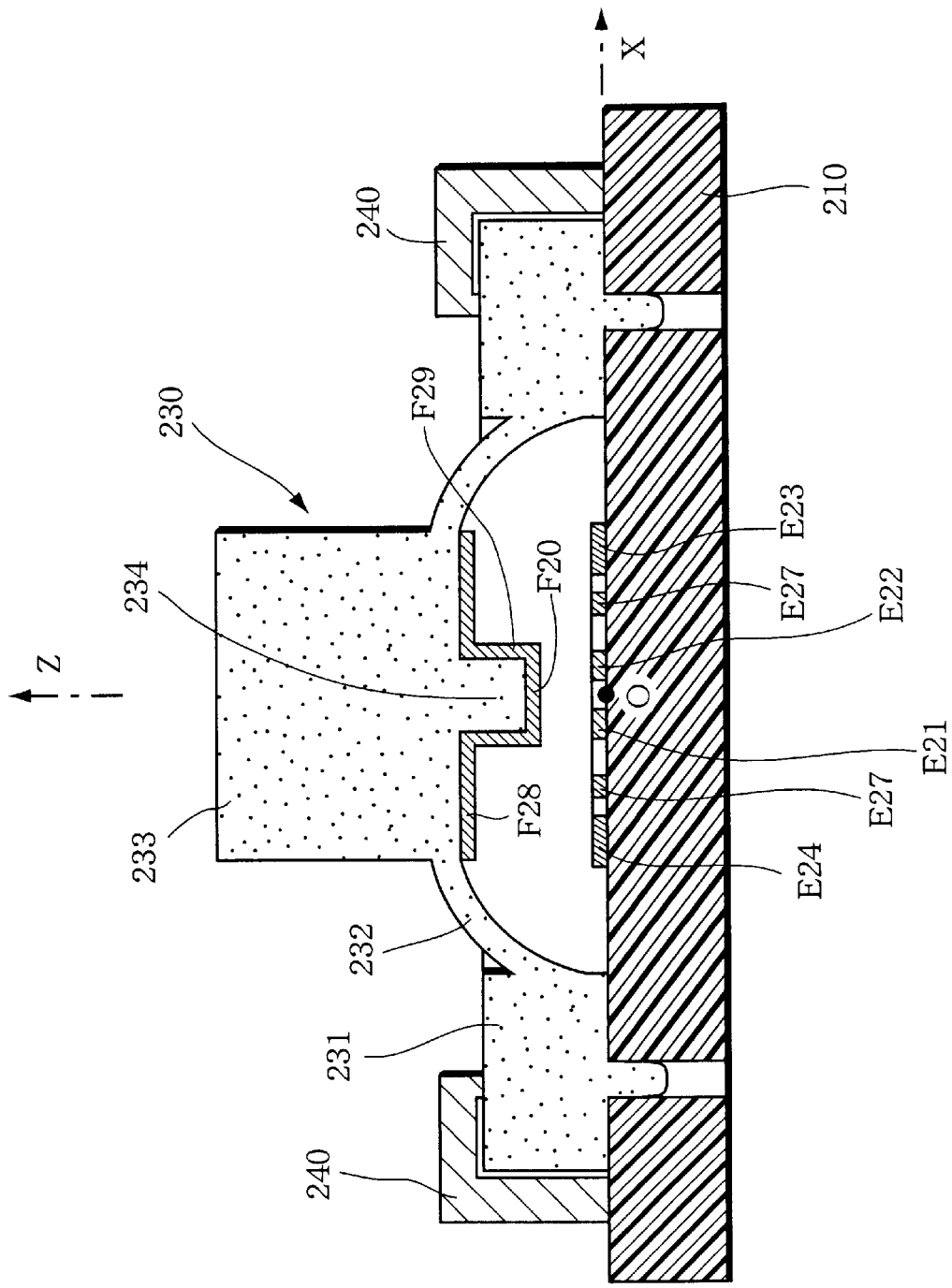
FIG. 14 is a cross-sectional side view, taken along the X-axis, illustrating the structure of a force sensor according to a second embodiment of the present invention.
Figure 15:
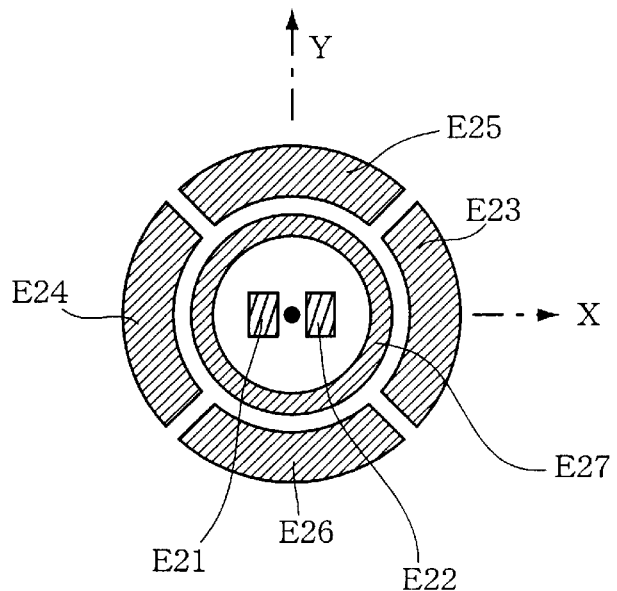
FIG. 15 is a top view illustrating an electrode pattern formed on the upper surface of the circuit board 210 of the force sensor shown in FIG. 14.

FIG. 14 is a cross-sectional side view illustrating the structure of a force sensor according to a second embodiment of the present invention. The force sensor comprises a circuit board 210, a strain generative body 230, and attachments 240 for fixing the strain generative body 230. Each of these components serves in almost the same manner as the circuit board 110, the strain generative body 130, and the attachments 140 of the force sensor shown in FIG. 1. However, a component that corresponds to the intermediate displacement board 120 shown in FIG. 1 does not exist and a securing portion 231 of the strain generative body 230 is directly fixed to the circuit board 210. This configuration is the same as the force sensor of FIG. 1 in that a connecting portion 232 having a bowl-shaped portion supports a cylindrical displacement portion 233 and a cylindrical elastic deformation portion 234 is formed on the lower surface of the displacement portion 233. On the upper surface of the circuit board 210, an electrode pattern that is similar to the one shown in FIG. 2 is formed. That is, switch securing electrodes E21, E22 (corresponding to E1, E2 of FIG. 2), and capacitor securing electrodes E23-E27 (corresponding to E3-E7 of FIG. 2) are arranged. FIG. 15 shows only the electrode pattern (For better understanding of the pattern, the electrode portions are shaded and the wiring layers are not shown in the figure.).

On the other hand, three types of electrode are formed on the side of the strain generative body 230. That is, the electrodes include a disc-shaped electrode F20 formed on the bottom surface of the cylindrical elastic deformation portion 234, a washer-shaped electrode F28 formed on the bottom surface of the displacement portion 233 and a cylindrical electrode F29 formed on the side surface of the cylindrical elastic deformation portion 234. The disc-shaped electrode F20 is opposite to the switch securing electrodes E21, E22 and serves as the switch displacement electrode (corresponding to the electrode F0 of the force sensor of FIG. 1). The washer-shaped electrode F28 is opposite to the capacitor securing electrodes E23-E27 and serves as the capacitance displacement electrode (corresponding to the displacement board displacement portion 122 of the force sensor of FIG. 1). In addition, the cylindrical electrode F29 functions as merely a wiring layer and serves to make a short circuit between the electrode F20 and the electrode F28. In the foregoing, for convenience in explanation, the electrodes F20, F28, F29 have been described as separate electrodes. However, in practice, these three types of the electrodes F20, F28, F29 are formed of a monolithic conductive layer covering the lower surface of the displacement portion 233, the side and lower surface of the elastic deformation portion 234. These electrodes may be comprised of any conductive material but may be preferably made in practice of conductive rubber or conductive ink. Moreover, the electrode F29 is required to function as merely a wiring layer and is thus not required to cover the entire side surface of the elastic deformation portion 234.

The operation of this force sensor as a push-button switch for detecting the operational ON/OFF input is exactly the same as that of the force sensor according to the first embodiment mentioned above. That is, the operator's downward depression of the displacement portion 233 carried out as the first-stage operation will cause the connecting portion 232 to be elastically deformed and the switch displacement electrode F20 to be brought into contact with the switch securing electrodes E21, E22. Thus, the electrodes E21, E22 are made conductive therebetween. The basic principle of the detection of the operational input at the second stage in this force sensor is also the same as that of the device according to the first embodiment mentioned above. That is, the capacitor securing electrodes E23-E27 that are formed on the side of the circuit board 210 and the capacitor displacement electrode F28 that is formed on the side of the strain generative body 230 form five sets of capacitors C23-C27. Thus, it is made possible to detect three-dimensional components of a force applied in the second-stage operation, based on a change in capacitance of these capacitors (The principle of the detection is the same as described in §2.).

Figure 16:
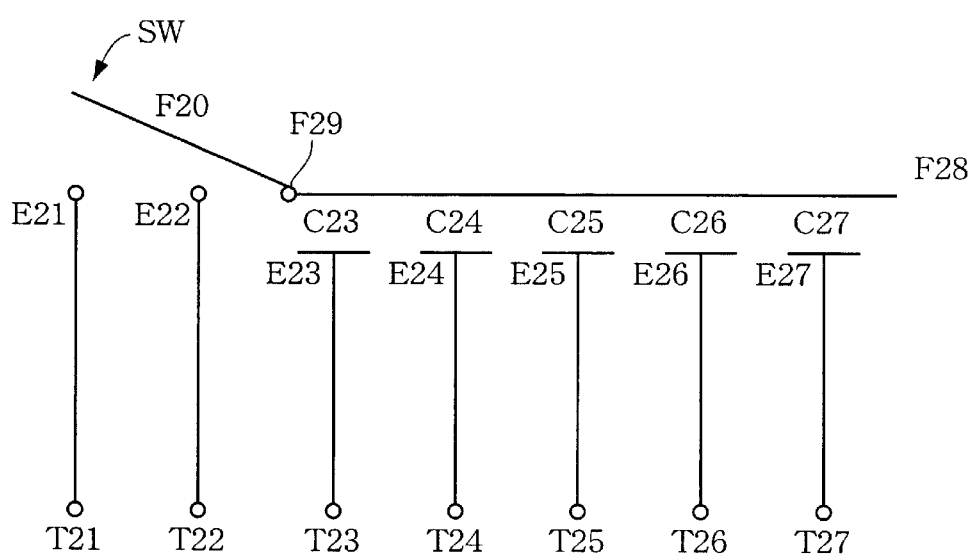
FIG. 16 is a circuit diagram illustrating an equivalent circuit of the force sensor shown in FIG. 14.

FIG. 16 is a circuit diagram illustrating an equivalent circuit of the force sensor shown in FIG. 14. In the circuit diagram, the electrodes E21-E27 are illustrated which are formed on the circuit board 210 and connected to the terminals T21-T27 through wiring layers. The electrode F20 functions as the switch SW by making contact or not making contact with the electrodes E21, E22. The ON/OFF state of the switch SW can be detected by monitoring the conductive state between the terminals T21, T22. As described above, the electrode F20 is connected to the electrode F28 via the electrode F29 and the electrode F28 functions as the capacitor displacement electrode that is opposite to the capacitor securing electrodes E23-E27, thereby forming five sets of capacitors C23-C27.

An advantage of the embodiment described here lies in that no wiring is required on the side of the strain generative body 230. As described above, on the side of the strain generative body 230 are formed three types of electrodes F20, F28, F29, for which no wiring leading to the outside is required. Referring to the circuit diagram of FIG. 16, each of the terminals T21-T27 is adapted to be connected to an exterior circuit but the electrodes F20, F28, F29 are not connected to any exterior circuit and are thus isolated. However, when the electrode F20 comes into contact with the electrodes E21, E22, the electrode F28 is connected to the terminals T21, T22. For example, with the terminal T21 being fixed at a predetermined potential V (or may be grounded so that V=0), the ON/OFF state of the switch SW can be recognized based on whether the terminal T22 has come to the same potential as the potential V. When the switch SW is turned ON, the electrode F28 is also fixed to the potential V, thereby leading to a non-isolated state. As already mentioned in §2, in the force sensors according to the present invention, the second stage operation is carried out on the precondition that the first-stage operation has been carried out and the switch SW is kept at an ON state. Thus, when a force applied by the second-operation is detected based on a capacitance of the capacitors C23-C27, the switch SW is inevitably in an ON state. Suppose that no wiring leading to the outside has been provided to the electrode F28. Even in this case, when the capacitance of each capacitor needs to be detected, the electrode F28 is always connected to the terminals T21, T22, thus causing no problem to occur. In other words, the capacitance of each capacitor C23-C27 is detected as the capacitance between the terminal T21 (or T22, a switch securing electrode) and the terminals T23-T27 (or capacitor securing electrodes).

Figure 17:
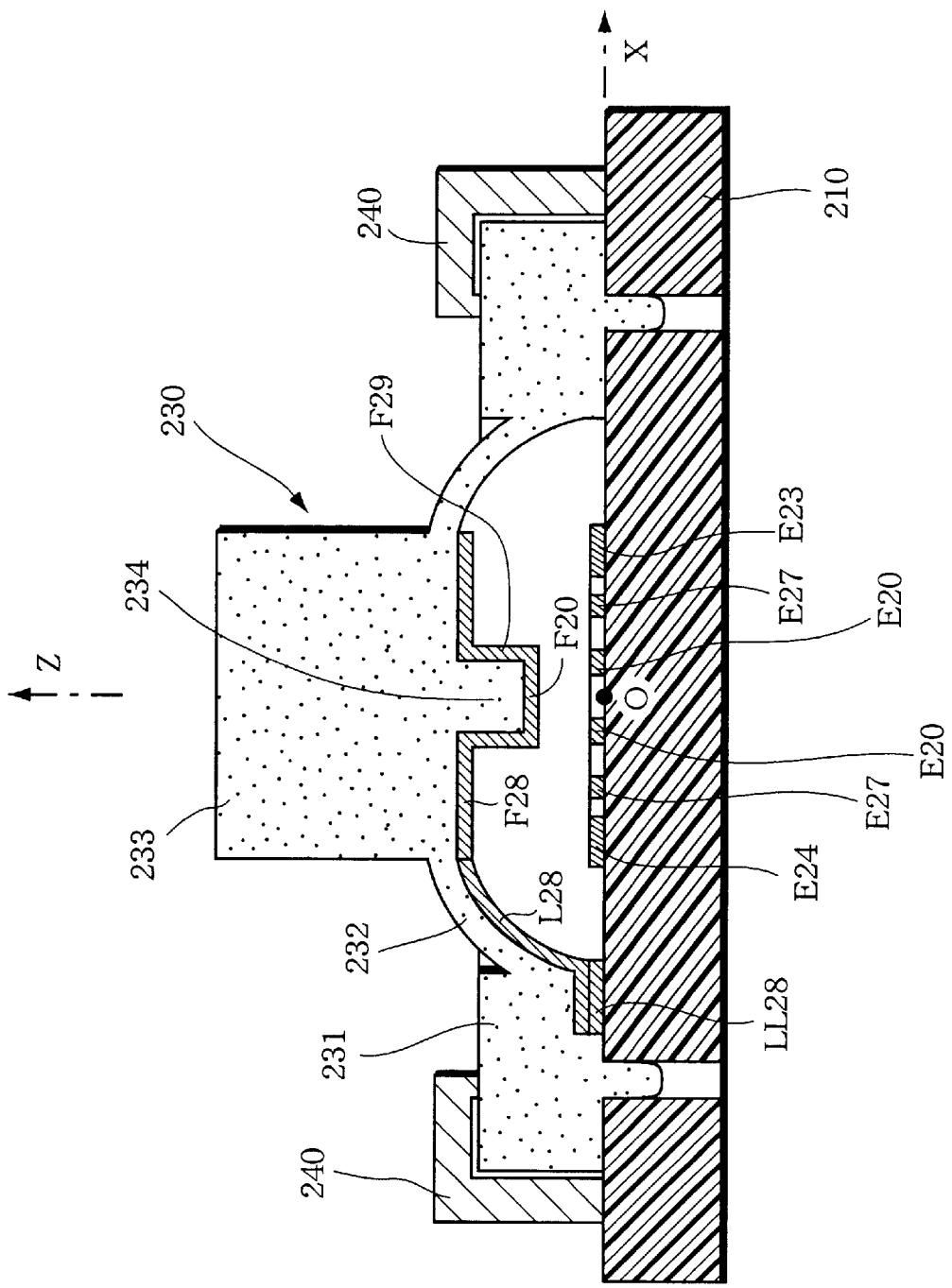
FIG. 17 is a cross-sectional side view, taken along the X-axis, illustrating a variation of the force sensor shown in FIG. 14.
Figure 1:
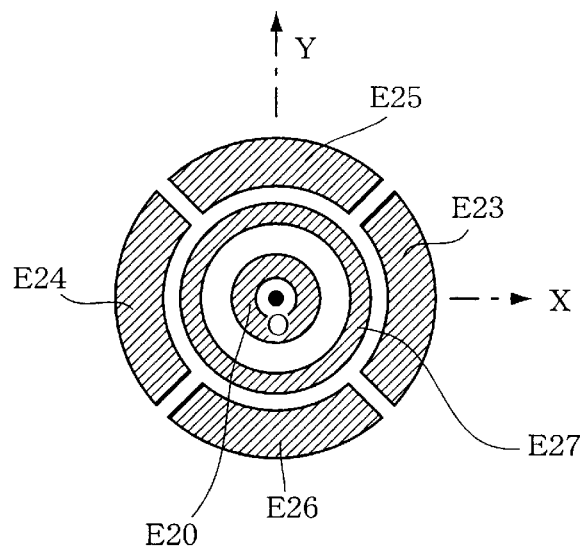
Figure 1:
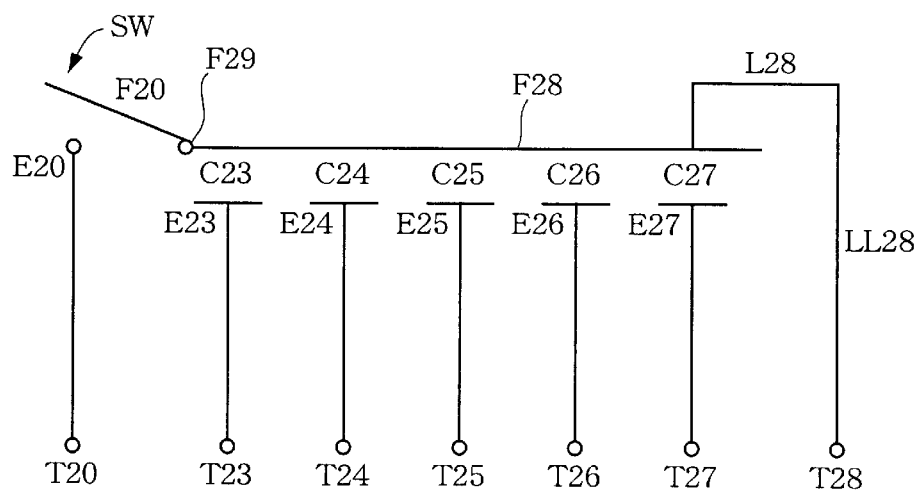

It is to be understood that the present invention is not limited to the embodiment in which no wiring is provided to the side of the strain generative body 230, and wiring may be provided to both sides of the circuit board 210 and the strain generative body 230. FIG. 17 is a cross-sectional side view illustrating an embodiment in which wiring is provided on both the sides. The first different aspect of this embodiment from the one shown in FIG. 14 is that the electrode F28 on the side of the strain generative body 230 is provided with wiring or a wiring layer L28. In this example, the wiring layer L28 is formed along the lower surface of the connecting portion 232 and on the upper surface of the circuit board 210 another wiring layer LL28 is formed that is in contact with the edge of the wiring layer L28. The wiring layer LL28 on the side of the circuit board 210 is connected to a terminal T28 (not shown). The second different aspect is the electrode pattern that is formed on the upper surface of the circuit board 210. FIG. 18 shows this electrode pattern (For better understanding of the pattern, the electrode portions are shaded and the wiring layers are not shown in the figure.). The switch securing electrodes E21, E22 in the pattern shown in FIG. 15 have been replaced with an annular electrode E20 in the pattern shown in FIG. 18. This is because wiring provided on the side of the strain generative body 230 requires only a single electrode for a switch securing electrode which is to be provided on the side of the circuit board.

FIG. 19 is a circuit diagram illustrating an equivalent circuit of the force sensor shown in FIG. 17. The first different aspect of this circuit from the one of FIG. 16 is that the electrode F28 is connected to the terminal T28 via the wiring layer L28, LL28. The second different aspect is that a pair of the electrodes E21, E22 is integrated into the single electrode E20 and the terminals T21, T22 are integrated into a single terminal T20. The operational ON/OFF input can be detected by monitoring the conductive state between the terminal T20 and the terminal T28. The capacitance of each of the capacitors C23-C27 can be detected by measuring the capacitance between the terminal T28 and each of the terminals T23-T27.

The force sensor according to the second embodiment obviates the intermediate displacement board that is required in the force sensor according to the first embodiment described in §1, thereby providing a simplified structure and a further reduction in cost. In practice, like the device described in §1, forming the circuit board 210 of a printed circuit board and the strain generative body 230 of silicon rubber offers a structure that is suitable for mass-production. In this case, the electrode pattern on the side of the circuit board 210 may be formed as a metal pattern on the printed circuit board, and the electrode pattern on the side of the strain generative body 230 may be formed of conductive rubber or conductive ink. The force sensor according to the second embodiment also provides the function of a push-button switch having a sufficient stroke and favorable click feeling, also enabling the detection of a force in each three-dimensional axial component.

As shown in FIG. 14 or 17, with no force being applied to the displacement portion 233, the distance between the counter electrodes that constitute the capacitor is relatively large, thus providing substantially zero capacitance actually measured under this condition. Therefore, a slight variation in position of the elastic deformation 234 may be caused by the temperature characteristic of silicon rubber that constitutes the strain generative body 230 and the hysteresis characteristic of deformation. However, even in this case, the output provided when no force is applied is extremely stable.

§5. Configuration of the Third Embodiment

Figure 20:
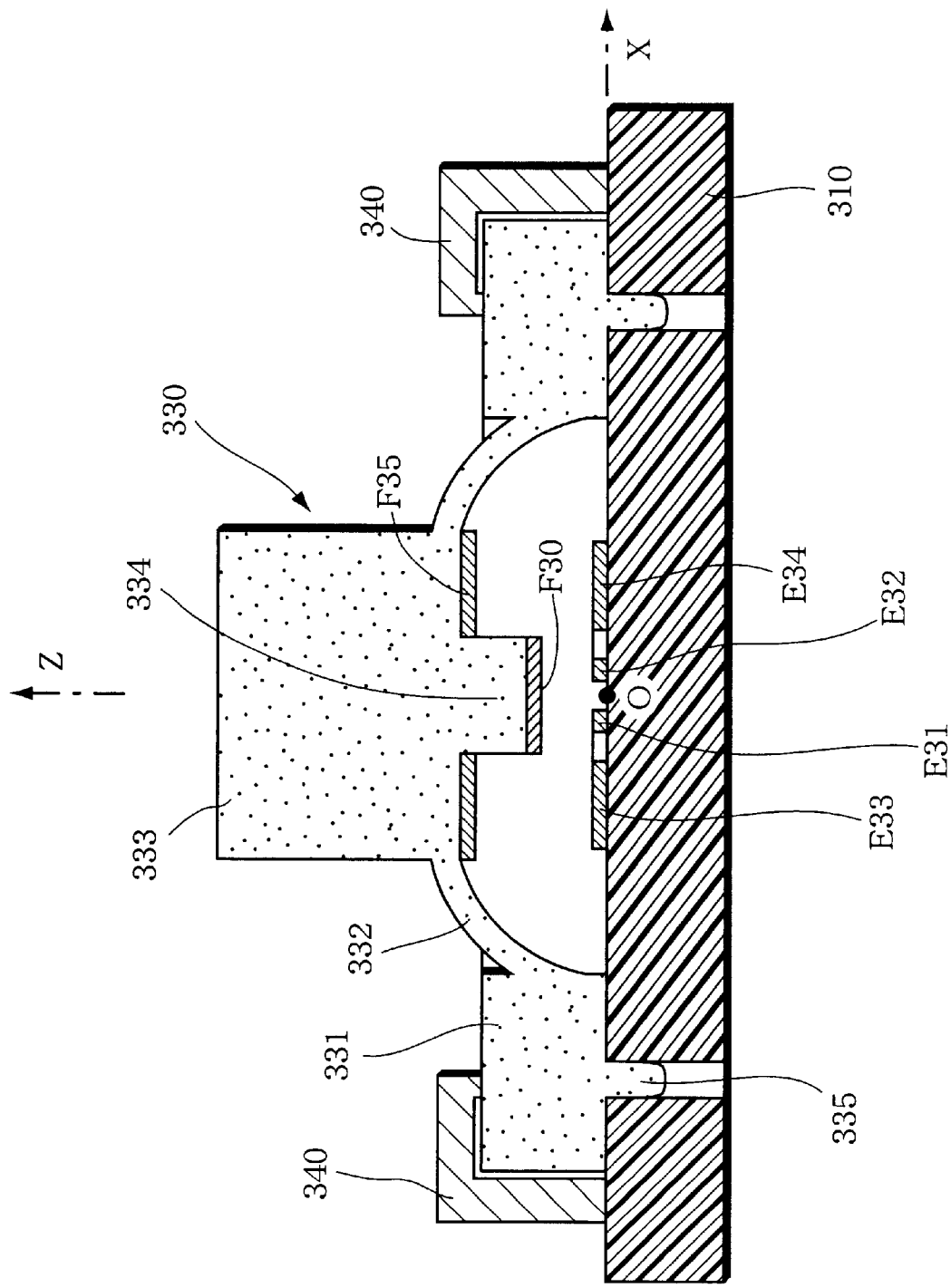
FIG. 20 is a cross-sectional side view, taken along the X-axis, illustrating the structure of a force sensor according to a third embodiment of the present invention.

FIG. 20 is a cross-sectional side view illustrating the structure of a force sensor according to a third embodiment of the present invention. This force sensor comprises a circuit board 310, a strain generative body 330, and attachments 340 for mounting the strain generative body 330. Each of these components serves in almost the same manner as the circuit board 210, the strain generative body 230, and the attachments 240 of the force sensor shown in FIG. 14, which were described as the second embodiment. That is, the strain generative body 330 comprises a securing portion 331, a connecting portion 332, a displacement portion 333, and a cylindrical elastic displacement portion 334 that is arranged on the lower surface thereof. The securing portion 331 is positioned on the circuit board 310 by attachment pins 335 provided on the lower surface of the securing portion 331 and is fixed by the attachments 340. The cylindrical displacement portion 333 is also supported by means of the connecting portion 332 having a bowl-shaped portion.

Figure 21:
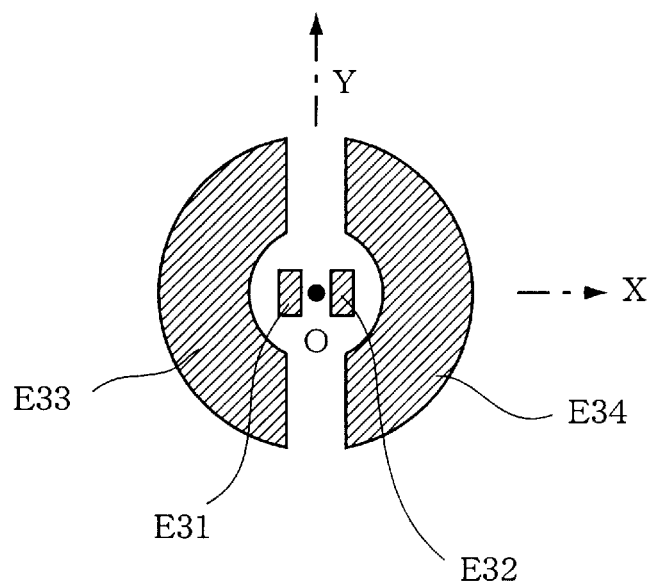
FIG. 21 is a top view illustrating an electrode pattern formed on the upper surface of a circuit board 310 of the force sensor shown in FIG. 20.

A major difference between the device shown in FIG. 20 and the one shown in FIG. 14 lies in the electrode pattern. FIG. 21 illustrates the electrode pattern formed on the circuit board 310 of the device shown in FIG. 20 (for better understanding of the pattern, the electrode portions are shaded and the wiring layers are not shown in the figure). As shown in the figure, only four electrodes E31-E34 are formed on the circuit board 310. The electrode pattern is simple as such because the device merely functions as one-dimensional force sensor for detecting force in the Z-axis direction in addition to the function as a push-button switch for detecting the operational ON/OFF input. Of the four electrodes, the electrodes E31, E32 serve as switch securing electrodes and the electrodes E33, E34 serve as capacitor securing electrodes. On the other hand, as shown in FIG. 20, two types of electrodes are formed on the side of the strain generative body 330. That is, a disc-shaped electrode F30 is formed on the bottom surface of the cylindrical elastic deformation portion 334 and a washer-shaped electrode F35 is formed on the bottom surface of the displacement portion 333 (the surface being the portion corresponding to the surrounding area of the portion where the elastic deformation portion 334 is formed.). The disc-shaped electrode F30 is arranged opposite to the switch securing electrodes E31, E32 and functions as the switch displacement electrode. The washer-shaped electrode F35 is arranged opposite to the capacitor securing electrodes E33, E34 and functions as the capacitor displacement electrode.

Figure 22:
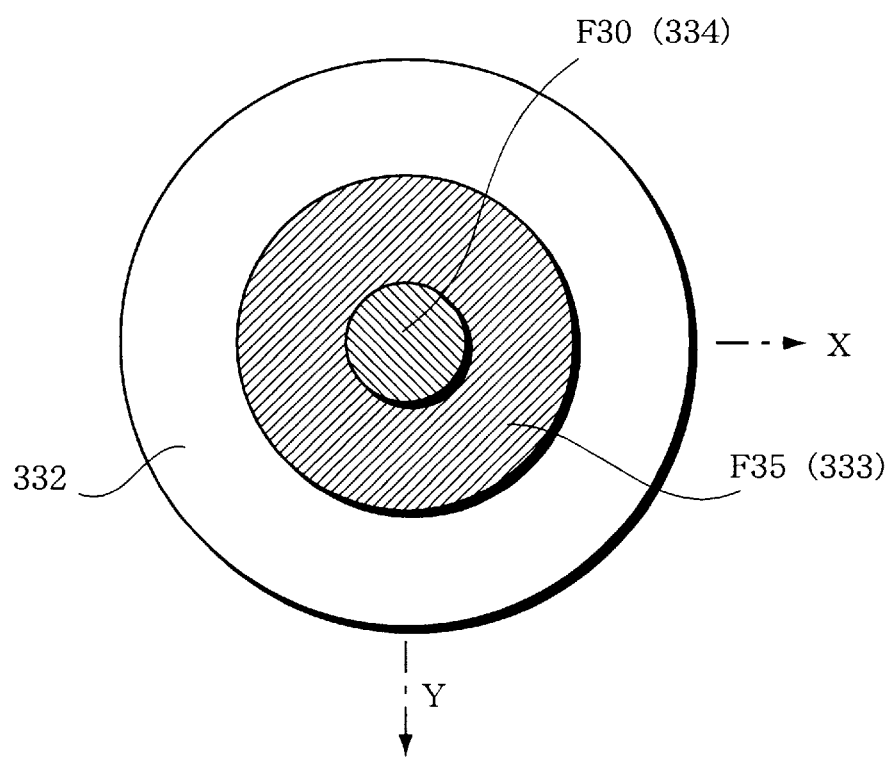
FIG. 22 is a bottom view illustrating the center portion of a strain generative body 330 of the force sensor shown in FIG. 20 (where the electrodes F30, F35 are shaded).

FIG. 22 is a bottom view illustrating the center portion of the strain generative body 330 (only the portion inside the connecting portion 332 is shown). Referring to FIG. 22, in order to see the pattern of the electrodes F30, F35 easily, hatching is applied to these electrode portions. The operation of this force sensor as a push-button switch for detecting the operational ON/OFF input is exactly the same as that of the force sensor according to the first or second embodiment mentioned above. That is, when the operator depresses the displacement portion 333 downward as the first-stage operation, the connecting portion 332 is elastically deformed, causing the switch displacement electrode F30 to be brought into contact with the switch securing electrodes E31, E32 and thus making the electrodes E31, E32 conductive therebetween. Therefore, monitoring the conductive state between the electrodes E31, E32 allows the operational ON/OFF input to be detected.

Figure 23:
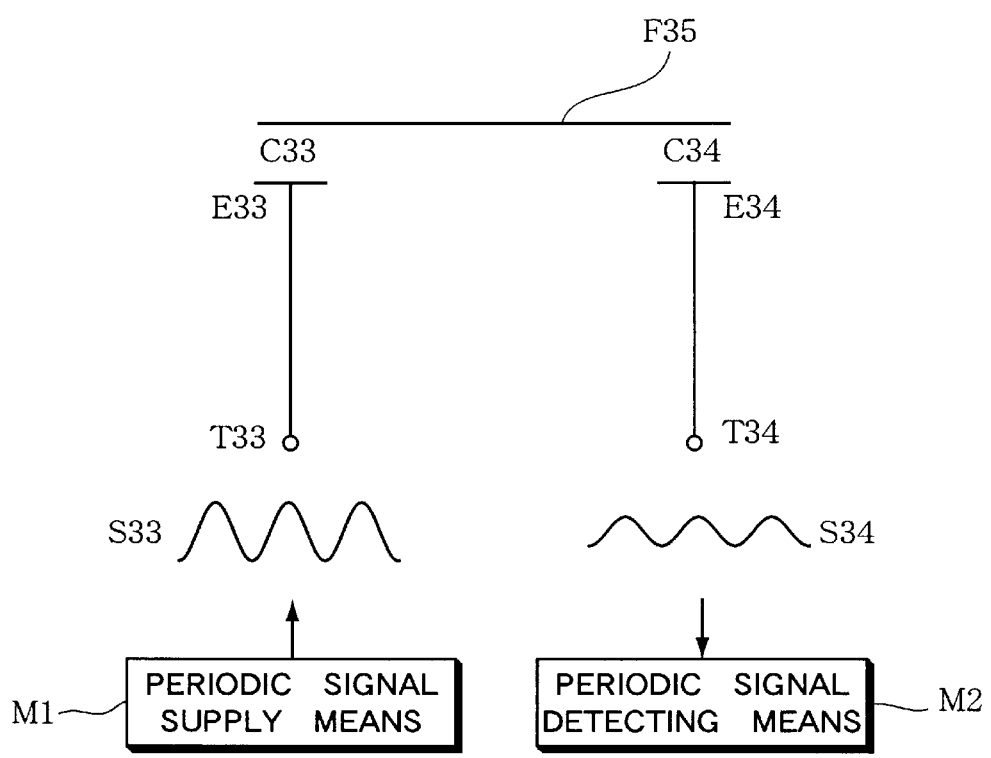
FIG. 23 is a circuit diagram illustrating an equivalent circuit of the force sensor shown in FIG. 20.

On the other hand, the principle of detecting the second-stage operational input in this force sensor is slightly different from the ones that have been previously described. FIG. 23 is a circuit diagram illustrating an equivalent circuit of a portion associated with capacitors in the force sensor shown in FIG. 20. This circuit diagram shows the electrodes E33, E34 formed on the circuit board 310 that are connected to terminals T33, T34 through wiring layers. In addition, this also shows a pair of capacitors C33, C34 that result from the presence of the electrode F35 that is arranged opposite to those components. Here, the capacitor C33 is to be referred to as the signal input capacitor and the capacitor C34 as the signal output capacitor. Eventually, these two sets of the capacitors C33, C34 are to comprise the securing electrodes E33, E34 that are electrically independent of each other and the single displacement electrode F35 that is electrically conductive.

As shown in the circuit diagram of FIG. 23, the securing electrode E33 of the signal input capacitor C33 is supplied with a predetermined periodic signal S33 (e.g., a sinusoidal wave) via the terminal T33 from a periodic signal supply means M1. The periodic signal S33 is transmitted to the displacement electrode F35 via the capacitive coupling of the capacitor C33 and transmitted to the securing electrode E34 of the signal output capacitor C34 via the capacitive coupling of the capacitor C34. Thus, a periodic signal S34 that is induced in the securing electrode E34 is detected by a periodic signal detecting means M2 via the terminal T34. The use of such a circuit allows the periodic signal detecting means M2 to detect the periodic signal S34, with the periodic signal S33 of a predetermined magnitude having been supplied by the periodic signal supply means M1. Moreover, it is made possible to determine a change in capacitance of the two sets of the capacitors C33, C34 based on the magnitude of the periodic signal S34. This is because the greater the capacitance of the capacitors C33, C34, the greater the coupling coefficient of the capacitive coupling becomes, thereby making greater the amplitude of the periodic signal S34 to be induced.

As described above, this force sensor only functions as a push-button switch for detecting the operational ON/OFF input and as a one-dimensional force sensor for detecting force in the Z-axis direction. That is, when the operator applies a depressing force to the displacement portion 333 toward the circuit board 310 as the first-stage operational input, the electrode F30 comes into contact with the electrodes E31, E32 and the operational input of an ON state is detected. Under this condition, when the operator further applies a depressing force to the displacement portion 333 toward the circuit board 310 as the second-stage operational input, the elastic deformation portion 334 is elastically deformed and crushed, thus reducing the spacing between the electrode of the capacitors C33, C34. Here, the narrower the spacing between the electrodes of the capacitors C33, C34, the greater the capacitance of each capacitor becomes, thus thereby increasing the amplitude of the detected periodic signal S34. Eventually, by allowing the periodic signal supply means M1 to supply the periodic signal S33 having a constant amplitude, the magnitude of a force (in the negative Z-axis direction) applied by the operator is detected as an amplitude of the periodic signal S34 detected by the periodic signal detecting means M2.

An advantage of the embodiment described here lies also in that no wiring is required on the side of the strain generative body 330. As shown in FIG. 22, on the lower surface of the strain generative body 330 are formed the electrodes F30 and F35, which can be made of conductive rubber or conductive ink. In order to provide the electrodes F30 and F35 with wiring, it is necessary to provide the wiring layer along the connecting portion 332 since the displacement portion 333 is surrounded by the flexible connecting portion 332. As a matter of course, like the embodiment shown in FIG. 17, it is possible to form such a wiring layer along the connecting portion. However, the fact that the connecting portion always produces deflection should be taken into account to bear in mind that the wiring layer along the connecting portion is liable to break. Therefore, in practice, wiring should preferably be avoided on the side of the strain generative body as much as possible. The embodiment shown here uses the capacitive coupling of the capacitors for detection, thereby providing the advantage of obviating the need for wiring on the side of the strain generative body.

§6. Other Variants

Having described some embodiments according to the present invention, some variants that are applicable to all or part of these embodiments will now be described.

First, a variant for the elastic deformation will be described. The force sensor according to the present invention is characterized by the function as a push-button switch that detects the operational ON/OFF input. The sensor is also characterized by the function as a primary force sensor for further detecting the magnitude of the predetermined directional components of the forces applied after having been turned ON by the push-button switch function. This primary function as a force sensor is closely related to the elastic deformation of the elastic deformation portion. That is, the force detected by the function of the primary force sensor (a force detected using capacitors) is nothing but the force applied to elastically deform the elastic deformation portion. Therefore, the detection sensitivity of the force sensor is to be determined depending on the elastic deformation of the elastic deformation portion. That is, with an elastic deformation portion that is to be elastically deformed with a weak force, a force sensor suitable for the detection of relatively weak force (a force sensor with high sensitivity) could be made available. On the contrary, with an elastic deformation portion that requires a considerably strong force to be elastically deformed, a force sensor that is suitable for the detection of relatively strong force (a force sensor with low sensitivity) could be made available.

Figure 24:
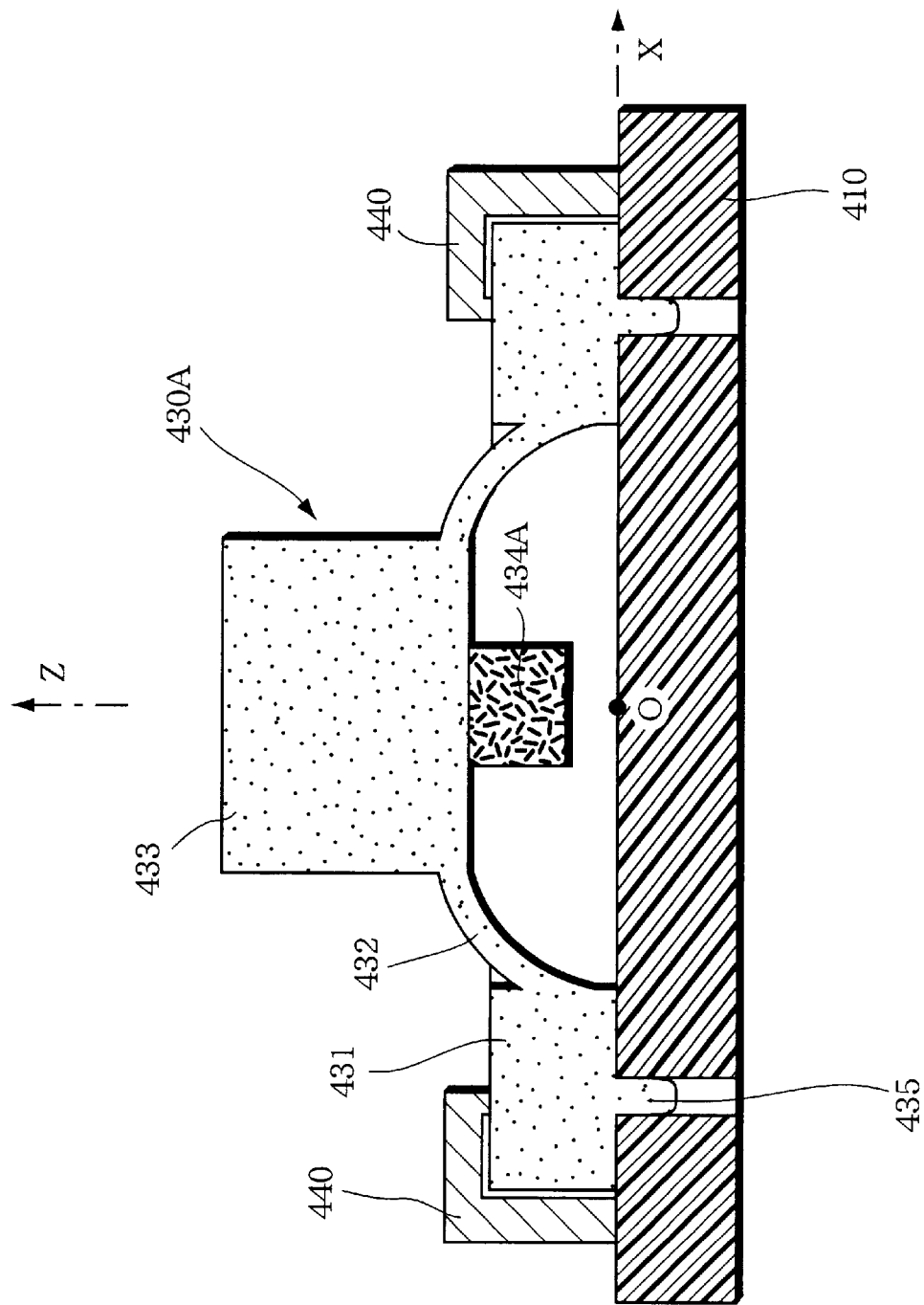
FIG. 24 is a cross-sectional side view, taken along the X-axis, illustrating a variation employing a different material for the elastic deformation portion.

One method of adjusting elastic deformation lies in the choice of material. That is, a force sensor having desired detection sensitivity can be implemented by making the elastic deformation portion of a material having an elastic coefficient corresponding to the detection sensitivity. For example, the variant shown in the cross-sectional side view of FIG. 24 is an example of an elastic deformation portion 434A only for which a different material is used. This example shows a force sensor in which a strain generative body 430A is mounted on a circuit board 410 by means of the attachments 440, corresponding to the embodiment described in §4 or §5. Each of electrodes formed on the side of the circuit board 410, each of electrodes formed on the side of the strain generative body 430A, and wiring layers are not illustrated in the figure. The strain generative body 430A is to comprise an acting body having a securing portion 431, a connecting portion 432, and a displacement portion 433; the elastic deformation portion 434A; and attachment pins 435. Of these components, only the elastic deformation portion 434A is made of a different material. For example, silicon rubber can be adjusted in hardness by changing the constituents. Thus, composing the elastic deformation portion 434A of silicon rubber having constituents showing the properties of softness can increase the detection sensitivity. On the contrary, composing the elastic deformation portion 434A of silicon rubber having constituents showing the properties of hardness can decrease the detection sensitivity.

Figure 25:
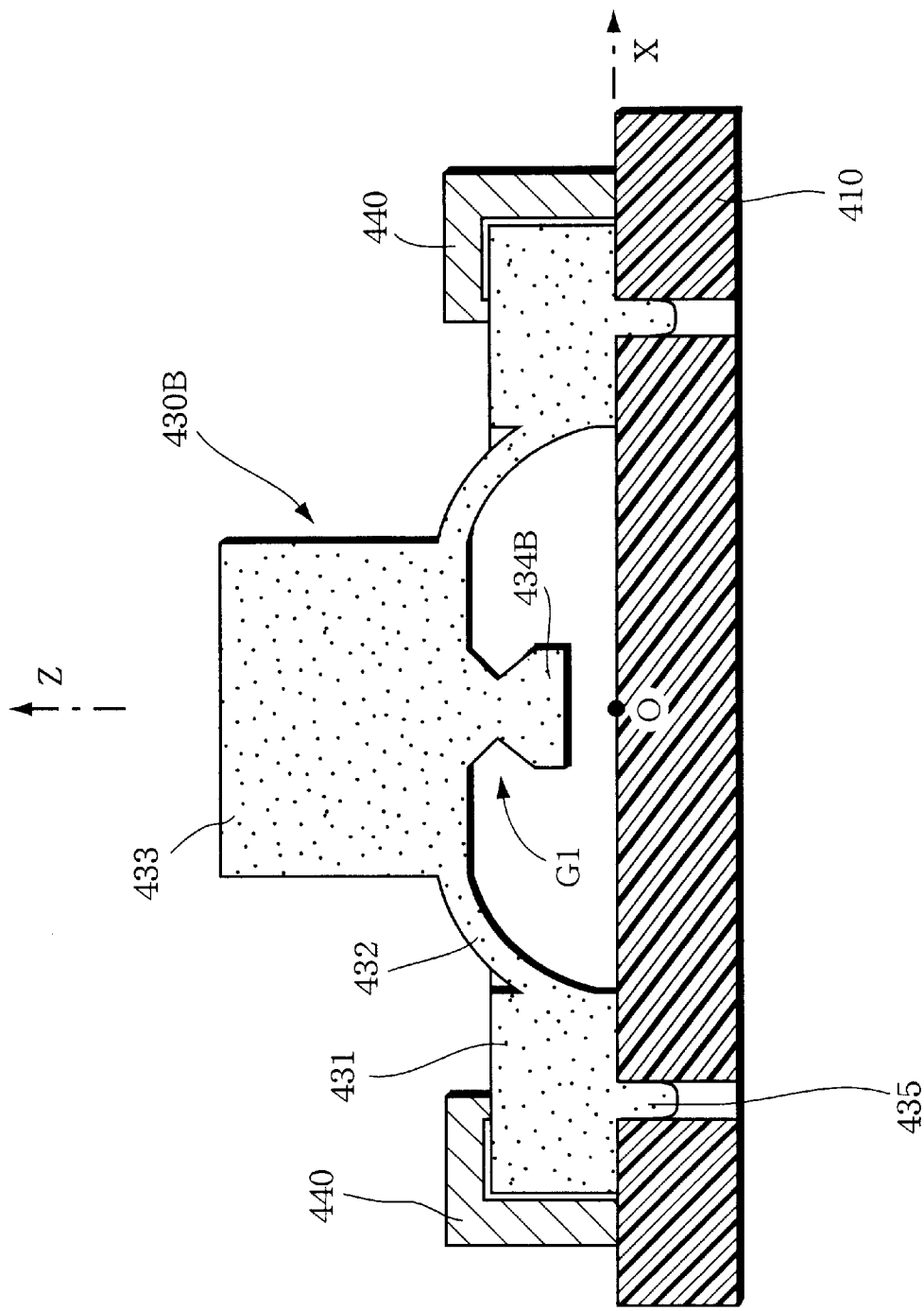
FIG. 25 is a cross-sectional side view, taken along the X-axis, illustrating a variation having a groove formed on a side surface of the elastic deformation portion.

Another method of adjusting elastic deformation lies in the choice of shape. For example, a force sensor having desired detection sensitivity can be implemented by forming a groove in the elastic deformation portion corresponding to the detection sensitivity. For example, the variant shown in the cross-sectional side view of FIG. 25 is an example with an elastic deformation portion 434B having a groove G1 on the side portion. A strain generative body 430B comprises an acting body having the securing portion 431, the connecting portion 432, and the displacement portion 433; the elastic deformation portion 434B; and attachment pins 435. Each of these components is integrally composed of the same material, for example, silicon rubber. However, by adjusting the size or depth of the groove G1 formed on the elastic deformation portion 434B, the elastic deformation of the elastic deformation portion 434B can be varied, thus making it possible to adjust the sensitivity of detection.

Figure 26:
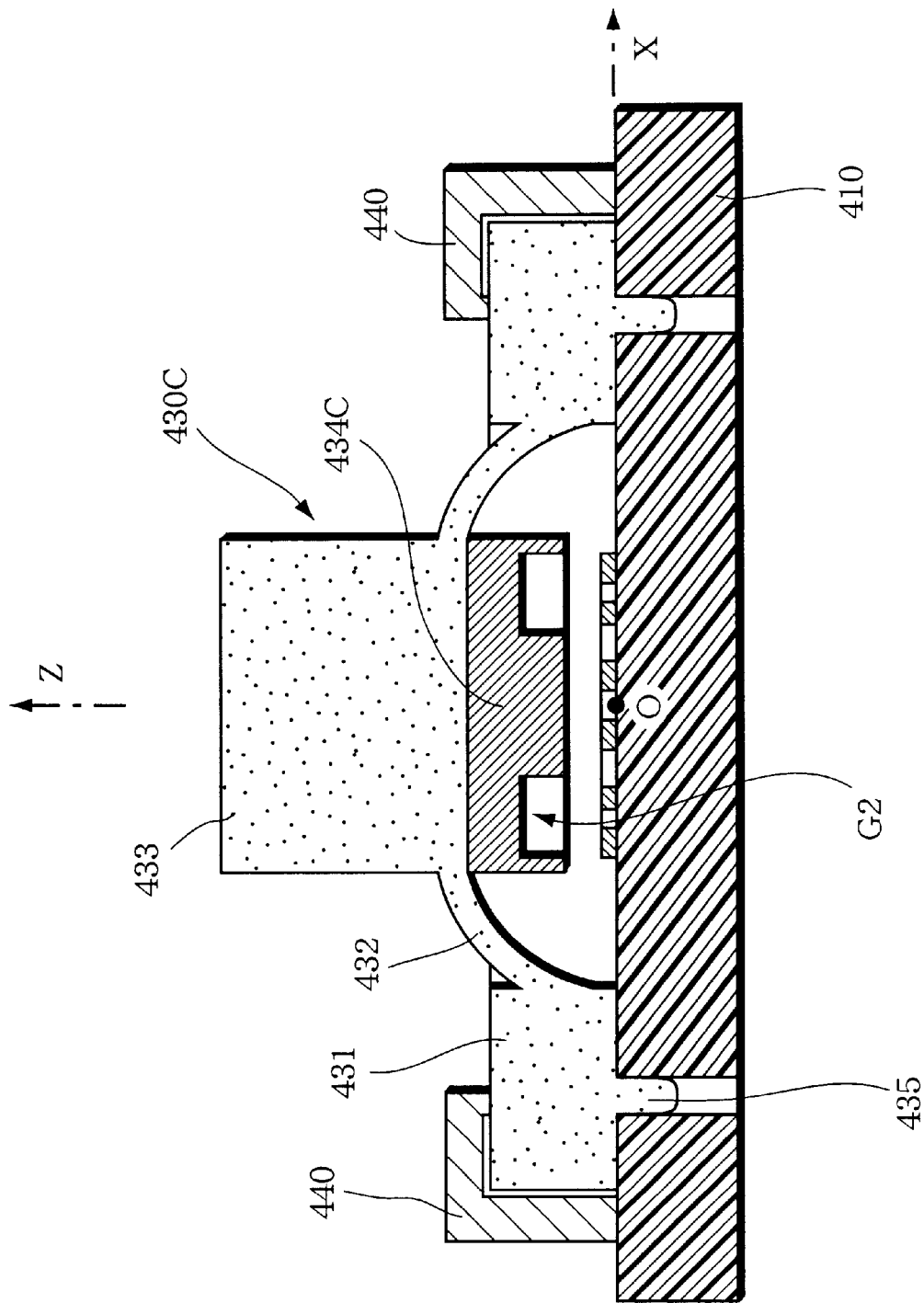
FIG. 26 is a cross-sectional side view, taken along the X-axis, illustrating a variation having a groove formed on the bottom surface of the elastic deformation portion.
Figure 27A:
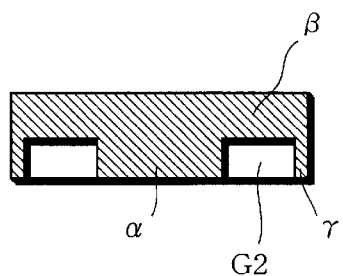
FIGS. 27a and 27b are a cross-sectional side view and a bottom view illustrating the elastic deformation portion 434C shown in FIG. 26.
Figure 27B:
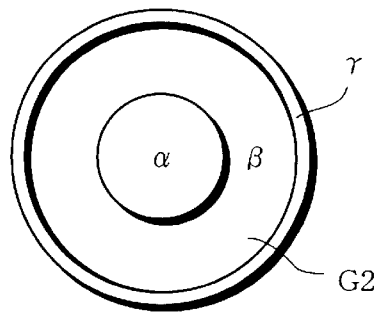

The variant shown in the cross-sectional side view of FIG. 26 is an example showing an approach to adjust the detection sensitivity for a certain axial component of a force. A strain generative body 430C shown here employs an elastic deformation portion 434C. This elastic deformation portion 434C may be composed of the same material as that of the acting body (the securing portion 431, the connecting portion 432, and the displacement portion 434) or may be composed of a different material. The elastic deformation portion 434C is characterized by having an annular groove G2 formed on the bottom. FIG. 27a is a cross-sectional side view illustrating only the elastic deformation portion 434C and FIG. 27b illustrates a bottom view thereof. The elastic deformation portion 434C comprises a center portion $\alpha$, a thin-layered portion $\beta$, and a surrounding portion $\gamma$. The thin-layered portion $\beta$ corresponds to the area in which annular groove G2 is formed. By forming the groove G2 at the position corresponding to the capacitor securing electrodes to be formed on the circuit board 410, the bottom surface of the elastic deformation portion 434C would not directly contact with the capacitor securing electrodes. This can be ensured even when the bottom surface of the elastic deformation portion 434C is brought into contact with the upper surface of the circuit board 410, thereby preventing the capacitor securing electrodes constituting the capacitors from being short-circuited with each other.

Use of the elastic deformation portion 434C having such a shape can increase the detection sensitivity in the X or Y-axis direction. That is, in the Z-axis direction, without an applied force of a magnitude strong enough to crush the block-shaped center portion $\alpha$, no sufficient detection output could be obtained from the capacitors. On the other hand, in the X or Y-axis direction, with an applied force of a magnitude strong enough to crush the thin wall-formed surrounding portion $\gamma$, a sufficient detection output can be obtained from the capacitors. As a matter of course, by providing the walls constituting the surrounding portion $\gamma$ with a different thickness at the X-axis and the Y-axis, it is also possible to change the detection sensitivity for the X and Y-axis direction.

Figure 28A:
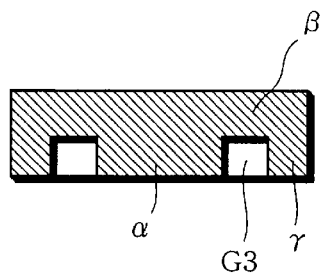
FIGS. 28a and 28b are a cross-sectional side view and a bottom view illustrating a first variation of the elastic deformation portion 434C shown in FIGS. 27a and 27b.
Figure 28B:
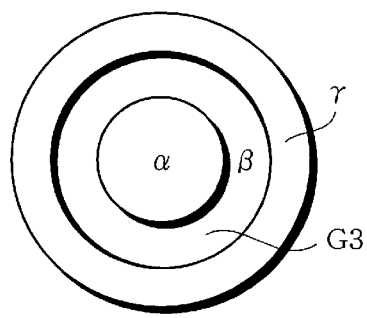
Figure 29A:
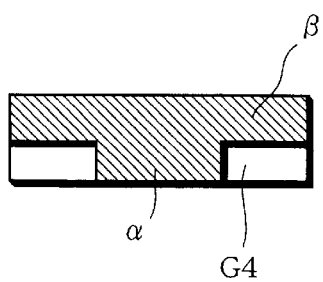
FIGS. 29a and 29b are a cross-sectional side view and a bottom view illustrating a second variation of the elastic deformation portion 434C shown in FIGS. 27a and 27b.
Figure 29B:
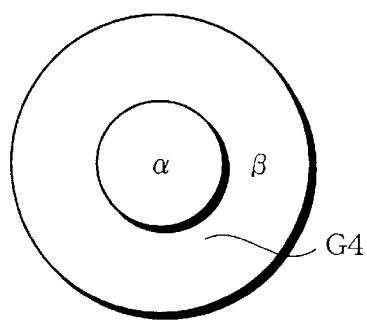

FIGS. 28a and 28b show an example in which the width of the groove is made narrower. That is, a groove G3 shown in FIGS. 28a and 28b has a narrower width than the groove G2 shown in FIGS. 27a and 27b, thereby increasing the width of the wall that constitutes the surrounding portion $\gamma$. This makes the wall constituting the surrounding portion $\gamma$ less crushed even when a force is applied in the X or Y-axis direction, thus resulting in slightly reduced detection sensitivity in the X and Y-axis direction. On the contrary, FIGS. 29a and 29b show an example in which the width of the groove is made wider. That is, a groove G4 shown in FIGS. 29a and 29b has a wider width than the groove G2 shown in FIGS. 27a and 27b, and the wall that constitutes the surrounding portion $\gamma$ is disappeared. This allows the detection sensitivity in the X or Y-axis direction to be considerably increased.

In the foregoing, the technique of adjusting the detection sensitivity of force has been described by adjusting the elastic deformation of the elastic deformation portion 434. In addition, adjusting the elastic deformation of the connecting portion 432 also enables adjustment of the click feeling of the push-button switch that detects the operational ON/OFF input. For example, by reducing the thickness of the connecting portion 432, a push-button switch that provides a softer click feeling can be made available. Conversely, by increasing the thickness of the connecting portion 432, a push-button switch that provides a harder click feeling can be made available. In practice, it is preferably designed so that the ON/OFF switching operation and the detection sensitivity of force are made optimum, taking both the elastic deformations of the connecting portion 432 and the elastic deformation portion 434 into account. For example, depressing first the displacement portion 433 toward the circuit board 410 with a relatively weak force can cause the push-button switch to be turned ON. Then, under this condition, a stronger force can be applied to move the displacement portion 433 back and forth and sideward (along the X- or Y-axis) or downward (along the Z-axis), thereby making it possible to provide an operational input of the desired magnitude in the desired direction. Such an operational input is suitable for an input operation such as for game machines or cellular phones.

Figure 30:
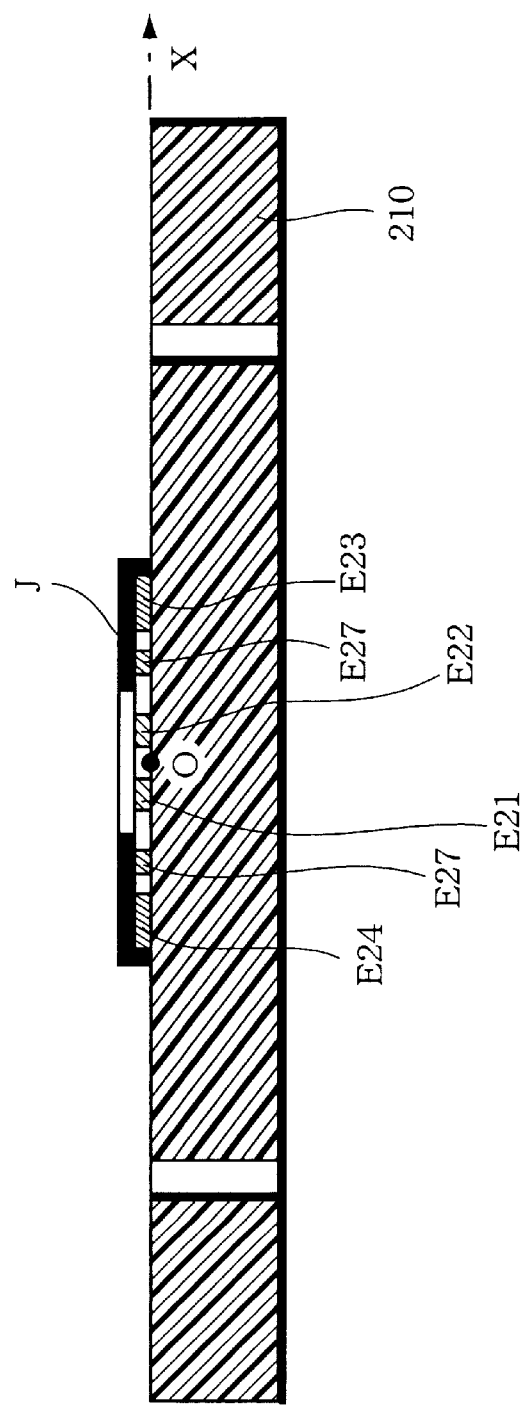
FIG. 30 is a cross-sectional side view illustrating a variation of capacitor securing electrodes formed on the circuit board, an insulation film J being formed on the electrodes.

FIG. 30 is a cross-sectional side view illustrating an example in which insulation films are formed on the surface of the capacitor securing electrodes formed on a circuit board. The circuit board 210 shown here is the same as the circuit board 210 that is used in the device shown in FIG. 14. The switch securing electrodes E21, E22 and the capacitor securing electrodes E23-E27 are formed on this circuit board 210. Since the switch securing electrodes E21, E22 are here required to make electrical contact with the switch displacement electrode F20, the electrodes need to remain exposed. However, since the capacitor securing electrodes E23-E27 constitute the capacitors, the surfaces thereof may be preferably covered with some insulation film J, as shown in the figure. The surface of the capacitor displacement electrode to be formed on the side of the strain generative body may be covered with an insulation film.

Figure 31:
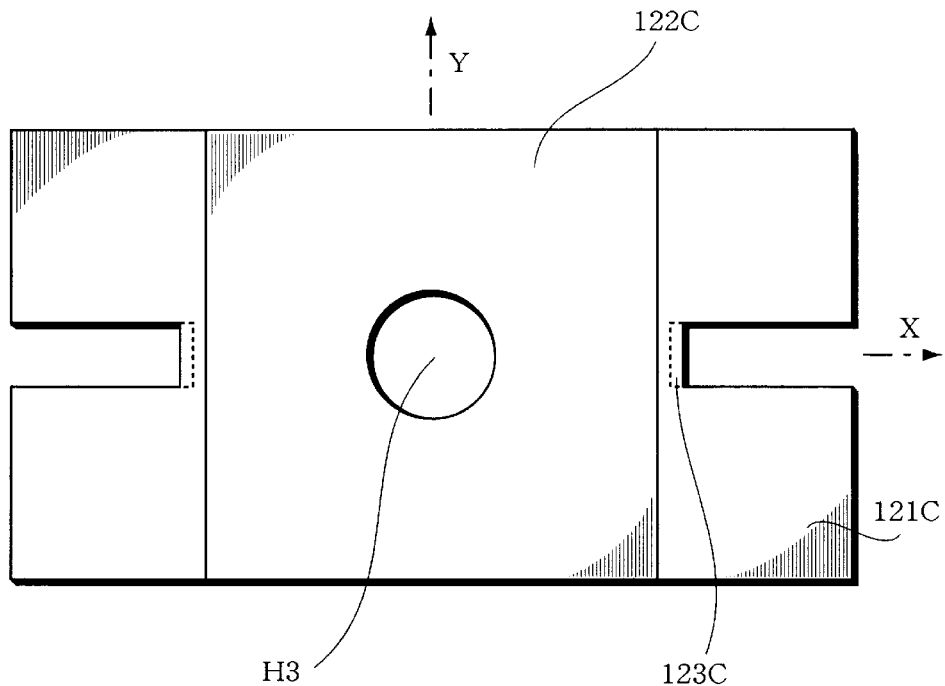
FIG. 31 is a top view illustrating a variation of the intermediate displacement board shown in FIG. 3.
Figure 32:
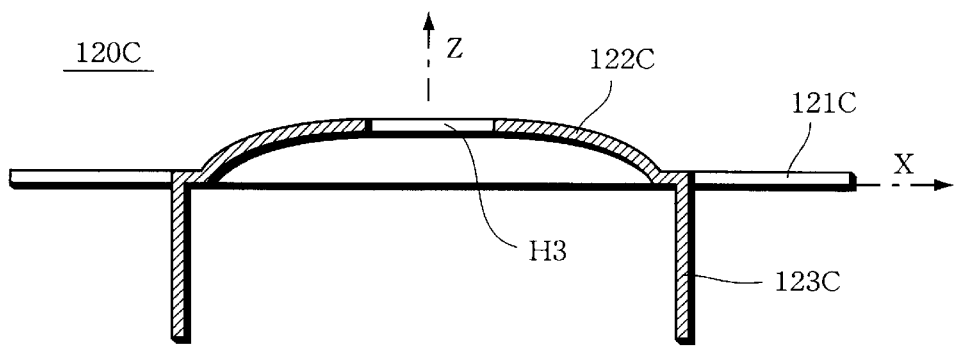
FIG. 32 is a cross-sectional side view, taken along the X-axis, illustrating the intermediate displacement board 120C shown in FIG. 31.

FIG. 31 is a top view illustrating a variant of the intermediate displacement board 120 shown in FIG. 3 and FIG. 32 is a cross-sectional side view thereof. The intermediate displacement board 120 shown in FIG. 3 has a generally circular shape when viewed from above, whereas an intermediate displacement board 120C shown in FIG. 31 has a generally rectangular shape when viewed from above. That is, displacement board securing portions 121C are formed on both the right and left ends and a displacement board displacement portion 122C is formed on the central portion. As shown in FIG. 32, this displacement board displacement portion 122C is formed in the shape of a convex with the open window H3 being formed in the center. Such intermediate displacement board 120C is to be mounted on a circuit board. As such, the shape of each of the components, which are used in the various embodiments mentioned above, can be modified in design as appropriate.

In the aforementioned embodiments, a common electrode is provided on the side of the strain generative body or the intermediate displacement board and each of the electrodes that are electrically independent of each other is provided on the side of the circuit board to form the capacitors. However, conversely, individual electrodes that are electrically independent may be provided on the side of the strain generative body or the intermediate displacement board and a common electrode may be provided on the side of the circuit board. Alternatively, without the common electrode being provided, individual electrodes that are electrically independent of each other may be provided on both of the sides. However, in practice, as in the aforementioned embodiments, it is preferable to provide the individual electrodes, which are electrically independent of each other, on the side of the circuit board, which makes it easy to form a complicated wiring pattern thereon. In addition, the common electrode may preferably be provided on the side of the strain generative body or on the intermediate displacement board. This arrangement will preferably simplify the entire configuration including the wiring.

Any of the devices according to the various embodiments, which have been described above, function as a three-dimensional force sensor except for in one embodiment (the third embodiment described in §5). However, in some applications, the force sensor is required to function only as a two-dimensional force sensor or only as a one-dimensional force sensor. In those cases, such capacitors as required for detection are sufficiently provided. Referring to the example shown in FIG. 2, for example, suppose that only the electrode E7 is provided as the capacitor securing electrode. In this case, it is possible to detect the Z-axial component of an applied force, thereby making the device available as a force sensor for detecting a one-dimensional force in the Z-axis direction. Alternatively, only the two electrodes E3, E4 may be provided as the capacitor securing electrodes, thereby making it possible to form two sets of the capacitors C3, C4 arranged on the X-axis. The X-axis component of an applied force can be detected, based on the difference in capacitance between the two sets of the capacitors, thereby making the device available as a force sensor for detecting a one-dimensional force in the X-axis direction. In the latter case, the Z-axis component of the force can also be detected, based on the sum of capacitance of the two sets of the capacitors C3, C4, thereby making the device available as a force sensor for detecting a two-dimensional force in the X- and Z-axis directions.

What is claimed is:

1. A force sensor comprising:
   a circuit board arranged at a position where an upper surface thereof is contained in an X-Y plane when an XYZ three-dimensional coordinate system is defined;
   an acting body attached to the upper surface of said circuit board, said acting body having a displacement portion arranged above said circuit board and displaced when an external force is applied thereto, a securing portion fixed to said circuit board, and a connecting portion for connecting said displacement portion to said securing portion;
   an elastic deformation body, formed on a lower, surface of said displacement portion and having elastic deformation properties;
   a switch displacement electrode formed on a lower surface of said elastic deformation body;
   a switch securing electrode formed on a position opposite to said switch displacement electrode on said circuit board; and
   a capacitor adapted to produce a variation in capacitance caused by a displacement of said displacement portion;
   wherein said connecting portion has flexibility so that when a force is applied to said displacement portion, a deflection is produced in said connecting portion, thereby causing a displacement in said displacement portion relative to said circuit board;
   wherein when no force is applied to said displacement portion, said switch displacement electrode and said switch securing electrode are not kept in contact with each other, and when a force of a predetermined amount, including a component along a Z-axis of said coordinate system, is applied to said displacement portion, said switch displacement electrode and said switch securing electrode are brought into control with each other;
   wherein when a further force, including a component along said taxis, is applied to said displacement portion, said elastic deformation body is elastically deformed, thereby allowing capacitance of amid capacitor to vary, with the contact state kept unchanged between said switch displacement electrode and said switch securing electrode; and
   wherein said switch displacement electrode and said switch securing electrode form a switch which is closed when said displacement electrode is brought into contact with said securing electrode, whereafter when said elastically deformable body is elastically deformed, a change in capacitance of said capacitor is electrically detected to thereby recognize magnitude of a predetermined directional component of an applied force.

2. A force sensor according to claim 1:
   wherein an acting body having a bowl-shaped portion is prepared and attached to the upper surface of the circuit board to be upside down, to use a portion corresponding to a bottom of the bowl as a displacement portion, to use a portion corresponding to a side of the bowl as a connecting portion, and to use a portion corresponding to a mouth of the bowl as a securing portion.

3. A force sensor according to claim 2:
   wherein an intermediate displacement board is disposed between the circuit board and the acting body so that a part of the intermediate displacement board is secured to the circuit board as a displacement board securing portion and another part of the intermediate displacement board constitutes a displacement board displacement portion for generating a displacement caused by a displacement in the displacement portion or a deformation in the connecting portion; and
   a capacitor securing electrode formed on the circuit board and a capacitor displacement electrode formed on said displacement board displacement portion constitute a capacitor.

4. A force sensor according to claim 3:
   wherein a flexible plate having a bowl-shaped portion constitutes the intermediate displacement board, said intermediate displacement board being attached to the upper surface of the circuit board so as to arrange the bowl-shaped portion upside down, an open window being formed for allowing the elastic deformation body to penetrate therethrough on a portion corresponding to a bottom of the bowl, a portion surrounding the open window constituting the displacement board displacement portion, a portion corresponding to a mouth of the bowl constituting the displacement board securing portion, and the displacement portion or the connecting portion being brought into physical contact with the displacement board displacement portion to generate a displacement.

5. A force sensor according to claim 4:

wherein the intermediate displacement board is made of a metal material and the intermediate displacement board itself is used as a capacitor displacement electrode.

6. A force sensor according to claim 4:

wherein the intermediate displacement board is made of synthetic resin and a metal film formed on a lower surface thereof composes a capacitor displacement electrode.

7. A force sensor according to claim 6:

wherein a first additional switch electrode is formed on an upper surface of the intermediate displacement board and a second additional switch electrode is formed at a position opposite to said first additional switch electrode provided on a lower surface of the displacement portion so that both of said additional switch electrodes constituting an additional switch and a contact state between said first additional switch electrode and said second additional switch electrode is electrically detected, thereby enabling to provide additional information regarding an applied force.

8. A force sensor according to claim 7:

wherein when the Z-axis is defined at a center of the displacement portion, an additional switch is provided at a position located above a positive X-axis and another additional switch is provided at a position located above a negative X-axis, thereby enabling to provide information regarding an X-axis component of an applied force, based on a state of a pair of the additional switches.

9. A force sensor according to claim 8:

wherein an additional switch is further provided at a position located above a positive Y-axis and another additional switch is further provided at a position located above a negative Y-axis, thereby enabling to provide information regarding a Y-axis component of an applied force, based on a state of a pair of the further additional switches.

10. A force sensor according to claim 7:

wherein among a set of counter electrodes constituting the additional switch, one electrode is composed of a single electrode layer and the other electrode is composed of a pair of electrode layers, electrically independent of each other, and a conductive state between said pair of electrode layers is electrically detected, thereby enabling detection of a contact state of said counter electrodes.

11. A force sensor according to claim 1:

wherein a capacitor securing electrode formed on the upper surface of the circuit board and a capacitor displacement electrode formed on a lower surface of the displacement portion constitute a capacitor.

12. A force sensor according to claim 11:

wherein wiring is provided for making the capacitor displacement electrode and the switch displacement electrode conductive therebetween so that when the switch displacement electrode and the switch securing electrode are brought into contact with each other, capacitance between the switch securing electrode and the capacitor securing electrode is measured to detect a capacitance of the capacitor.

13. A force sensor according to claim 11:

wherein when the Z-axis is defined at a center of the displacement portion, a first capacitor is provided at a position located above a positive X-axis and a second capacitor is provided at a position located above a negative X-axis so as to determine direction and magnitude of an X-axis component of an applied force based on a difference in capacitance between a pair of said first and second capacitors.

14. A force sensor according to claim 13:

wherein a third capacitor is further provided at a position located above a positive Y-axis and a fourth capacitor is provided at a position located above a negative Y-axis so as to determine direction and magnitude of a Y-axis component of an applied force based on a difference in capacitance between a pair of said third and fourth capacitors.

15. A force sensor according to claim 11:

wherein a capacitor having an electrode formed to be generally symmetric with both the X- and Y-axes is provided so that a magnitude of a Z-axis component of an applied force can be determined based on capacitance of said capacitor.

16. A force sensor according to claim 11:

wherein two sets of capacitors including a signal input capacitor and a signal output capacitor are provided, respective capacitor securing electrodes of said two sets of capacitors are composed of separate electrodes electrically independent of each other and respective capacitor displacement electrodes of said two sets of capacitors are composed of a single common electrode electrically conductive with each other; and periodic signal supply means for supplying a periodic signal to a capacitor securing electrode of said signal input capacitor and periodic signal detection means for detecting a periodic signal induced in a securing electrode of said signal output capacitor are provided so that a change in capacitance between said two sets of capacitors is obtained based on a magnitude of the periodic signal to be detected by means of said periodic signal detection means when the periodic signal of a predetermined magnitude is supplied by means of said periodic signal supply means.

17. A force sensor according to claim 11:

wherein an insulation film is formed on a surface of any one or both of a capacitor securing electrode and a capacitor displacement electrode.

18. A force sensor according to claim 1:

wherein the switch displacement electrode is composed of a single electrode layer and the switch securing electrode is composed of a pair of electrode layers electrically independent of each other, and a contact state of said pair of the electrode layers is electrically detected so as to detect a contact state between said switch displacement electrode and said switch securing electrode.

19. A force sensor according to claim 1:

wherein the elastic deformation portion is composed of a material having an elastic coefficient corresponding to detection sensitivity.

20. A force sensor according to claim 1:

wherein the elastic deformation portion is provided with a groove corresponding to detection sensitivity.

21. A force sensor according to claim 1:

wherein the acting body and the elastic deformation portion are composed of a strain generative body integrally formed of rubber.

* * * * *